(12) United States Patent
Kawada et al.

(10) Patent No.: US 7,691,286 B2
(45) Date of Patent: Apr. 6, 2010

(54) PIEZOELECTRIC CERAMIC COMPOSITION, METHOD FOR MANUFACTURING THE SAME, AND PIEZOELECTRIC CERAMIC ELECTRONIC COMPONENT

(75) Inventors: Shinichiro Kawada, Hikone (JP); Ryoko Katayama, Higashiomi (JP); Katsuhiro Horikawa, Omihachiman (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 11/852,678

(22) Filed: Sep. 10, 2007

(65) Prior Publication Data

US 2008/0061263 A1    Mar. 13, 2008

Related U.S. Application Data

(63) Continuation of application No. PCT/JP2006/307769, filed on Apr. 12, 2006.

(30) Foreign Application Priority Data

Apr. 28, 2005  (JP) .............................. 2005-133254

(51) Int. Cl.
  *C04B 35/495*  (2006.01)
  *H01L 41/24*   (2006.01)
  *H01L 41/187*  (2006.01)

(52) U.S. Cl. ................ 252/62.9 R; 501/134; 501/135; 501/136; 501/137; 501/138; 310/363; 310/365; 310/366; 310/311

(58) Field of Classification Search ............ 252/62.9 R; 310/363, 365, 366, 311; 501/134–138
See application file for complete search history.

(56) References Cited

U.S. PATENT DOCUMENTS

| 4,812,426 A | * | 3/1989 | Takagi et al. ................. 501/136 |
| 6,083,415 A |   | 7/2000 | Kimura et al. |
| 6,093,339 A | * | 7/2000 | Kimura et al. .......... 252/62.9 R |
| 2002/0020949 A1 | | 2/2002 | Kuzuoka et al. |
| 2004/0058797 A1 | * | 3/2004 | Nonoyama et al. .......... 501/134 |
| 2006/0066180 A1 | * | 3/2006 | Nanataki et al. ............. 310/358 |

FOREIGN PATENT DOCUMENTS

| JP | 11-60333    | 3/1999 |
| JP | 2002-068835 | 3/2002 |

* cited by examiner

*Primary Examiner*—C. Melissa Koslow
(74) *Attorney, Agent, or Firm*—Dickstein, Shapiro, LLP.

(57) ABSTRACT

A piezoelectric ceramic composition includes a primary component represented by the formula $(1-x)(K_{1-a-b}Na_aLi_b)_m(Nb_{1-c-d}Ta_cSb_d)O_3-xM1_nM2O_3$, and 0.1 to 10 moles (preferably 1.5 to 10 moles) of at least one specific element selected from the group consisting of In, Sc, Y, Nd, Sm, Eu, Gd, Tb, Dy, Ho, Er, Yb, and Lu with respect to 100 moles of the primary component, wherein M1 is Ca, Sr, or Ba M2 is Ti, Zr, or Sn; and x, a, b, c, d, m, and n satisfy $0.005 \leq x \leq 0.1$, $0 \leq a \leq 0.9$, $0 \leq b \leq 0.3$, $0 \leq a+b \leq 0.9$, $0 \leq c \leq 0.5$, $0 \leq d \leq 0.1$, $0.9 \leq m \leq 1.1$, and $0.9 \leq n \leq 1.1$. Preferably, Mn, Ni, Fe, Zn, Cu, or Mg is further added. As a result, at both a very low and a high electric field, a high piezoelectric d constant can be stably obtained with a high efficiency.

19 Claims, 2 Drawing Sheets

PIEZOELECTRIC CERAMIC COMPOSITION, METHOD FOR MANUFACTURING THE SAME, AND PIEZOELECTRIC CERAMIC ELECTRONIC COMPONENT

CROSS REFERENCE TO RELATED APPLICATIONS

The present application is a continuation of International Application No. PCT/JP2006/307769, filed Apr. 12, 2006, which claims priority to Japanese Patent Application No. JP2005-133254, filed Apr. 28, 2005, the entire contents of each of these applications being incorporated herein by reference in their entirety.

FIELD OF THE INVENTION

The present invention relates to a piezoelectric ceramic composition, a method for manufacturing the same, and a piezoelectric ceramic electronic component, and more particularly, relates to a lead-free piezoelectric ceramic composition containing no Pb (lead), a method for manufacturing the above piezoelectric ceramic composition, and a piezoelectric ceramic electronic component, such as a piezoelectric actuator or a piezoelectric buzzer, manufactured by using the above piezoelectric ceramic composition.

BACKGROUND OF THE INVENTION

In recent years, in consideration of environmental conservation, attention has been paid to a lead-free piezoelectric ceramic composition which contains no Pb; however, it has been known that a piezoelectric d constant of the lead-free piezoelectric ceramic composition is generally low as compared to that of a lead-based piezoelectric ceramic composition such as PZT ($PbTiO_3$—$PbZrO_3$).

Under circumstances as described above, since a (K,Na)$NbO_3$-based piezoelectric ceramic composition has a relatively high piezoelectric d constant (piezoelectric strain constant) among lead-free piezoelectric ceramic compositions, research and development of the (K,Na)$NbO_3$-based piezoelectric ceramic composition has been aggressively carried out.

For example, in Patent Document 1, a piezoelectric ceramic composition has been disclosed which contains a primary component represented by the general formula of $(1-n)(K_{1-x-y}Na_xLi_y)_m(Nb_{1-z}Ta_z)O_3$-$nM1M2O_3$ (where M1 is a divalent metal element, and M2 is a tetravalent metal element), and in Patent Document 2, a piezoelectric ceramic composition has been disclosed which contains a primary component represented by the general formula of $(1-n)(K_{1-x-y}Na_xLi_y)_m(Nb_{1-z}Ta_z)O_3$-$nM1M2M3O_3$ (where M1 is a trivalent metal element, M2 is a monovalent metal element, and M3 is a tetravalent metal element). In addition, in both Patent Documents 1 and 2, x, y, z, m, and n are adjusted so as to satisfy $0.1 \leq x$, $y \leq 0.3$, $x+y<0.75$, $0 \leq z \leq 0.3$, $0.98 \leq m \leq 1.0$, and $0<n<0.1$.

According to Patent Documents 1 and 2, when a predetermined number of moles of a perovskite composite oxide $M1M2O_3$ or $M1M2M3O_3$ (such as $BaTiO_3$, $CaTiO_3$, or $(Na_{0.5}Bi_{0.5})TiO_3$) is solid-dissolved as a third component in (K,Na,Li)(Nb,Ta)$O_3$, a piezoelectric ceramic composition is obtained which has a relative dielectric constant ∈r ($=∈^T/∈_0$; $∈^T$ represents the absolute dielectric constant, and $∈_0$ represents the vacuum dielectric constant) of 1,000 or more, an electromechanical coupling factor kp of 25% or more, and a Curie point Tc of more than 200° C.

In addition, in Patent Document 3, a piezoelectric ceramic composition has been disclose which contains 0.005 to 0.15 moles of at least one metal element selected from the group consisting of Ag, Al, Au, B, Ba, Bi, Ca, Ce, Co, Cs, Cu, Dy, Er, Eu, Fe, Ga, Gd, Ge, Hf, Ho, In, Ir, La, Lu, Mg, Mn, Nd, Ni, Pd, Pr, Pt, Rb, Re, Ru, Sc, Si, Sm, Sn, Sr, Tb, Ti, Tm, V, Y, Yb, Zn, and Zr with respect to 1 mole of a primary component represented by $\{Li_x(K_{1-y}Na_y)_{1-x}\}(Nb_{1-z-w}Ta_zSb_w)O_3$ (where $0 \leq x \leq 0.2$, $0 \leq y \leq 1$, $0<z \leq 0.4$, and $0<w \leq 0.2$) and which has an open porosity of 0.4 percent by volume or less.

According to Patent Document 3, it has been disclosed that when the open porosity (the amount of dimples generated in the surface of the piezoelectric ceramic composition is represented by volume percent) is controlled to be 0.4 percent by volume or less by addition of the above Ag to Zr metal elements, the mechanical strength can be improved. In addition, since the composition represented by the general formula of $\{Li_x(K_{1-y}Na_y)_{1-x}\}(Nb_{1-z-w}Ta_zSb_w)O_3$ is the primary component, by using superior piezoelectric d constant and electromechanical coupling factor kp of the compound represented by the above general formula, a piezoelectric ceramic composition having superior properties described above can be obtained.

In Patent Document 4, a piezoelectric ceramic composition has been disclosed which is represented by $\{(K_{1-x}Na_x)_{1-y}Ag_y\}NbO_3$-$z[M^{\alpha+}][O^{2-}]_{\alpha/2}$ (where $0 \leq x \leq 1$, $0 \leq y \leq 0.1$, $0 \leq z \leq 0.05$, and $0<y+z$; Mn is at least one metal element selected from the group consisting of Mn, Mg, In, Si, Ga, and Sb; and α is an average valance of metal element M).

According to this Patent Document 4, by addition of predetermined amounts Ag and at least one metal element selected from the group consisting of Mn, Mg, In, Si, Ga, and Sb to (K,Na)$NbO_3$, besides a decrease in the dielectric loss, that is, tan δ, and improvement in reliability, the piezoelectric d constant can be improved.

Patent Document 1: Japanese Unexamined Patent Application Publication No. 11-228227
Patent Document 2: Japanese Unexamined Patent Application Publication No. 11-228228
Patent Document 3: Japanese Unexamined Patent Application Publication No. 2004-244300
Patent Document 4: Japanese Unexamined Patent Application Publication No. 2002-68835

According to Patent Documents 1 and 2, a high relative dielectric constant ∈r of 1,000 or more is obtained by addition of $M1M2O_3$ or $M1M2M3O_3$ as a third component to (K,Na,Li)(Nb,Ta)$O_3$; however, when the content of the above third component is increased, since the electromechanical coupling factor kp is decreased, although an increase in piezoelectric d constant is slightly observed, the increase is not yet sufficient.

That is, among the piezoelectric d constant, the dielectric constant $∈^T$, and the electromechanical coupling factor kp, the following equation (1) holds.

[Equation 1]

$$d = kp\sqrt{\frac{\varepsilon^T}{Y}} \quad (1)$$

In the above equation, Y indicates Young's modulus.

Accordingly, in order to obtain a high piezoelectric d constant, the relative dielectric constant ∈r and the electromechanical coupling factor kp are both preferably increased; however, as described in Patent Documents 1 and 2, when only $M1M2O_3$ or $M3M4M2O_3$ is simply added as a third component to (K,Na,Li)(Nb,Ta)O$_3$, the electromechanical coupling factor kp is decreased as the content of the third component is increased, and even if the relative dielectric constant ∈r can be increased, there has been a problem in that a desired sufficiently high piezoelectric d constant cannot be obtained.

In addition, according to Patent Document 3, the open porosity can be suppressed to 0.4 percent by volume or less by addition of a metal element, such as In, to {Li$_x$(K$_{1-y}$Na$_y$)$_{1-x}$}(Nb$_{1-z-w}$Ta$_z$Sb$_w$)O$_3$; however, according to an experiment carried out by the inventors of the present invention, a significant improvement in piezoelectric d constant could not be observed, and it was found that a piezoelectric ceramic composition having a desired high piezoelectric d constant cannot be obtained.

In addition, according to Patent Document 4, by addition of Ag, and In or the like to (K,Na)NbO$_3$, d$_{31}$ is improved; however, the improving rate is small, and it was found that a piezoelectric ceramic composition having a sufficiently high piezoelectric d constant cannot be obtained.

In addition, in recent years, concomitant with development of a technique to decrease a ceramic layer thickness, a multilayer piezoelectric ceramic electronic component driven by a high electric field has been developed and has been practically used.

In addition, as a piezoelectric material for a multilayer piezoelectric ceramic electronic component driven by a high electric field, a material having a high piezoelectric d constant at a high electric field, which is an electric field to be actually used, is preferable.

However, in general, a piezoelectric d constant at a high electric field, that is, at a practical electric field, and a piezoelectric d constant at a very low electric field, which is usually measured, are different from each other. Although the piezoelectric d constant at a very low electric field is high, the piezoelectric d constant at a high electric field is not always high.

That is, a piezoelectric material is composed of many regions, which are called domains, having different spontaneous polarization directions. In addition, at a very low electric field, only 180° domains respond which have a spontaneous polarization direction parallel to the direction of an applied electric field. On the other hand, at a high electric field, besides the response of the 1800 domains, since 90° domains, which have a spontaneous polarization direction perpendicular to the applied electric field direction, rotate toward the direction of the applied electric field, so that a large strain is generated; hence, as a result, a piezoelectric d constant which is higher than that at a very low electric field can be obtained. However, at a high electric field which is more than a certain predetermined electric field, since most of the 90° domains fully rotate and become 180° domains, a large displacement cannot be obtained. In addition, since the domain structure may vary with a material composition, although a material having a high piezoelectric d constant at a very low electric field is used, by the influence of the domain structure, the piezoelectric d constant at a high electric field may not be so much higher than expected in some cases.

SUMMARY OF THE INVENTION

Through research carried out by the inventors of the present invention, according to a conventional lead-free piezoelectric ceramic composition as describe in Patent Documents 1 to 4, it was found that although the piezoelectric d constant at a very low electric field may be slightly improved, a sufficiently high piezoelectric d constant cannot be obtained, and that furthermore, a piezoelectric d constant at a higher electric field extremely differs from a desired piezoelectric d constant.

In consideration of the situations as described above, the present invention was made, and an object thereof is to provide a lead-free type piezoelectric ceramic composition which can realize a desired high piezoelectric d constant at both a very low and a high electric field, a method for manufacturing the above piezoelectric ceramic composition, and a piezoelectric ceramic electronic component manufactured using the above piezoelectric ceramic composition.

Through intensive research carried out by the inventors of the present invention to achieve the above object, it was found that in a (K,Na,Li)(Nb,Ta,Sb)O$_3$-based compound of a perovskite structure in which the elements are mixed together to have a predetermined molar ratio, when M1$_n$M2O$_3$ (M1 is Ca, Sr, or Ba, and M2 is Ti, Zr, or Sn) having another perovskite structure is solid-solved as a third component to form a primary component, and in addition, with respect to 100 moles of the primary component, when 0.1 to 10 moles in total of at least one specific element selected from the group consisting of In, Sc, Y, Nd, Sm, Eu, Gd, Tb, Dy, Ho, Er, Yb, and Lu is contained, a piezoelectric ceramic composition can be obtained which can increase both the relative dielectric constant ∈r and the electromechanical coupling factor kp, can obtain a high Curie point Tc, and furthermore, has a desired high piezoelectric d constant at both a very low and a high electric field.

The present invention was made based on the finding as described above, and a piezoelectric ceramic composition according to the present invention comprises a primary component represented by the general formula of {(1-x)(K$_{1-a-b}$Na$_a$Li$_b$)$_m$(Nb$_{1-c-d}$Ta$_c$Sb$_d$)O$_3$-xM1$_n$M2O$_3$} (where M1 represents at least one metal element selected from the group consisting of Ca, Sr, and Ba, and M2 represents at least one metal element selected from the group consisting of Ti, Zr, and Sn), wherein x, a, b, c, d, m, and n are set so as to satisfy 0.005≦x≦0.1, 0≦a≦0.9, 0≦b≦0.3, 0≦a+b≦0.9, 0≦c≦0.5, 0≦d≦0.1, 0.9≦m≦1.1, and 0.9≦n≦1.1, respectively, and 0.1 to 10 moles in total of at least one specific element selected from the group consisting of In, Sc, Y, Nd, Sm, Eu, Gd, Tb, Dy, Ho, Er, Yb, and Lu is contained with respect to 100 moles of the primary component.

In addition, through more intensive research carried out by the inventors of the present invention, it was found that when (M3$_{0.5}$Bi$_{0.5}$)$_p$M4O$_3$ (M3 is K or Na, and M4 is Ti, Zr, or Sn) having a perovskite structure is solid-solved in the above primary component, as is the above case, the piezoelectric d constant can be improved at both a very low and a high electric field.

That is, in the piezoelectric ceramic composition according to the present invention, a compound represented by (M3$_{0.5}$Bi$_{0.5}$)$_p$M4O$_3$ (where 0.9≦p≦1.1 holds, M3 is at least one metal element of K and Na, and M4 is at least one metal element selected from the group consisting of Ti, Zr, and Sn) may be contained in the primary component at a mixing molar ratio of 0.5 or less.

In addition, it was found that when a mixing molar ratio m of (K$_{1-a-b}$Na$_a$Li$_b$) to (Nb$_{1-c-d}$Ta$_c$Sb$_d$) is set so that 0.9≦m≦0.99 holds, a piezoelectric d constant at a high electric field can be more effectively improved.

That is, in the piezoelectric ceramic composition according to the present invention, the above m is preferably set so as to satisfy 0.9≦m≦0.99.

In addition, heretofore, a piezoelectric ceramic composition containing (K,Na)NbO$_3$ as a primary component has a very small firing temperature range in which a preferable sintered body can be obtained, and in practice, this has been a serious problem in view of mass production. Hence, it has been desired to increase the firing temperature range in which a preferable sintered body can be obtained.

Therefore, through further intensive research carried out by the inventors of the present invention, it was found that when the content of the above specific element is adjusted in the range of 1.5 to 10 moles with respect to 100 moles of the primary component, a firing temperature range $\Delta T$ in which a firing treatment can be stably performed can be increased. As a result, the variation in firing temperature during the firing treatment is not likely to cause adverse influence, occurrence of defectives is suppressed, and improvement in productivity can be achieved.

That is, in the piezoelectric ceramic composition according to the present invention, the above specific element is preferably contained in an amount of 1.5 to 10 moles in total with respect to 100 moles of the primary component.

Furthermore, it was found that when at least one metal element selected from the group consisting of Mn, Ni, Fe, Zn, Cu, and Mg in an amount of 0.1 to 10 moles in total is contained with respect to 100 moles of the primary component, the firing temperature range $\Delta T$ can be further increased.

That is, in the piezoelectric ceramic composition according to the present invention, 0.1 to 10 moles in total of at least one metal element selected from the group consisting of Mn, Ni, Fe, Zn, Cu, and Mg is preferably contained with respect to 100 moles of the primary component.

In addition, through further intensive research carried out by the inventors of the present invention, it was found that when the piezoelectric ceramic composition is manufactured using a powdered ceramic raw material of ultra fine particles having an average particle diameter $D_{50}$ of 0.60 μm or less and a specific surface area of 7.0 to 20.0 m$^2$/g, polarization defective fraction of a piezoelectric ceramic component can be reduced, and that a piezoelectric ceramic component having a higher piezoelectric d constant can be obtained.

That is, a method for manufacturing a piezoelectric ceramic composition, according to the present invention has the steps of forming a powdered ceramic raw material having an average particle diameter $D_{50}$ of 0.60 μm or less and a specific surface area of 7.0 to 20.0 m$^2$/g, and performing a firing treatment for the powdered ceramic raw material to manufacture the piezoelectric ceramic composition.

In addition, in the method for manufacturing a piezoelectric ceramic composition, according to the present invention, the specific surface area is preferably 10.0 m$^2$/g or more.

In addition, in a piezoelectric ceramic electronic component according to the present invention which has external electrodes on surfaces of a piezoelectric ceramic body, the piezoelectric ceramic body is formed of the above piezoelectric ceramic composition.

Furthermore, in the piezoelectric ceramic electronic component according to the present invention, internal electrodes may be embedded in the piezoelectric ceramic body.

According to the piezoelectric ceramic composition of the present invention, since the primary component is represented by the general formula of $\{(1-x)(K_{1-a-b}Na_aLi_b)_m(Nb_{1-c-d}Ta_cSb_d)O_3-xM1_nM2O_3\}$ (where M1 represents at least one metal element selected from the group consisting of Ca, Sr, and Ba, and M2 represents at least one metal element selected from the group consisting of Ti, Zr, and Sn), the above x, a, b, c, d, m, and n are set so as to satisfy $0.005 \leq x \leq 0.1$, $0 \leq a \leq 0.9$, $0 \leq b \leq 0.3$, $0 \leq a+b \leq 0.9$, $0 \leq c \leq 0.5$, $0 \leq d \leq 0.1$, $0.9 \leq m \leq 1.1$, and $0.9 \leq n \leq 1.1$, respectively, and 0.1 to 10 moles in total of at least one specific element selected from the group consisting of In, Sc, Y, Nd, Sm, Eu, Gd, Tb, Dy, Ho, Er, Yb, and Lu is contained with respect to 100 moles of the primary component, the piezoelectric d constant can be improved at both a very low and a high electric field. In particular, a piezoelectric ceramic composition with superior piezoelectric properties can be obtained which has a piezoelectric $d_{33}$ constant of 115 pC/N or more at a very low electric field and a piezoelectric d constant of 200 pC/N or more at a high electric field.

In addition, also when the compound represented by $(M3_{0.5}Bi_{0.5})_pM4O_3$ (where $0.9 \leq p \leq 1.1$ holds, M3 is at least one metal element of K and Na, and M4 is at least one metal element selected from the group consisting of Ti, Zr, and Sn) is contained in the primary component at a mixing molar ratio of 0.5 or less, as is the case described above, a piezoelectric ceramic composition having superior piezoelectric properties can be stably obtained, and hence various piezoelectric ceramic compositions in accordance with applications can be provided.

In addition, in the piezoelectric ceramic composition according to the present invention, when the above m is set so that $0.9 \leq m \leq 0.99$ holds, the piezoelectric properties can be further improved, and in particular, a piezoelectric ceramic composition can be obtained which has a piezoelectric $d_{33}$ constant of 130 pC/N or more at a very low electric field and a piezoelectric d constant of 250 pC/N or more at a high electric field.

Furthermore, in the piezoelectric ceramic composition according to the present invention, since the specific element is contained in an amount of 1.5 to 10 moles in total with respect to 100 moles of the primary component, the firing temperature range $\Delta T$ in which a firing treatment can be stably performed can be increased, and even when the variation in firing temperature occurs, generation of defectives can be suppressed. In particular, the temperature range $\Delta T$ can be set to 15° C. or more, and hence productivity can be improved.

In addition, in the piezoelectric ceramic composition according to the present invention, 0.1 to 10 moles in total of at least one metal element selected from the group consisting of Mn, Ni, Fe, Zn, Cu, and Mg may be contained with respect to 100 moles of the primary component, and hence the firing temperature range $\Delta T$ can be further increased. In particular, by the addition of the above divalent metal element, the temperature range $\Delta T$ can be further increased by approximately 15 to 25° C., that is, the temperature rang $\Delta T$ can be increased to approximately 40 to 55° C.

In addition, according to the method for manufacturing a piezoelectric ceramic composition, of the present invention, since the piezoelectric ceramic composition is manufactured by forming a powdered ceramic raw material having an average particle diameter $D_{50}$ of 0.60 μm or less and a specific surface area in the range of 7.0 to 20.0 m$^2$/g (preferably in the range of 10.0 to 20.0 m$^2$/g), and performing a firing treatment for the powdered ceramic raw material, the powdered ceramic raw material is an ultra fine powder and has superior dispersibility. Hence, the sintering temperature is decreased, an alkaline metal which is likely to evaporate during sintering is solid-solved in crystalline grains at a temperature lower than its evaporation temperature, the polarization defective fraction can be significantly reduced thereby, and in addition, a piezoelectric ceramic composition having a higher piezoelectric d constant can be manufactured with a high efficiency.

In addition, according to the piezoelectric ceramic electronic component of the present invention, in a piezoelectric ceramic electronic component having external electrodes formed on surfaces of a piezoelectric ceramic body, since the piezoelectric ceramic body is formed of the above piezoelectric ceramic composition, a piezoelectric ceramic electronic component having a high piezoelectric constant not only at a very low electric field but also at a high electric field can be stably obtained.

In addition, in the piezoelectric ceramic electronic component according to the present invention, internal electrodes may be embedded in the above piezoelectric ceramic body. Even in the case of a multilayer piezoelectric ceramic electronic component, such as a piezoelectric actuator, which is driven at a high electric field, a high piezoelectric d constant can be obtained at a driving electric field, so that a piezoelectric ceramic electronic component having superior piezoelectric properties can be stably obtained with a high efficiency.

REFERENCE NUMERALS

Figure 1:
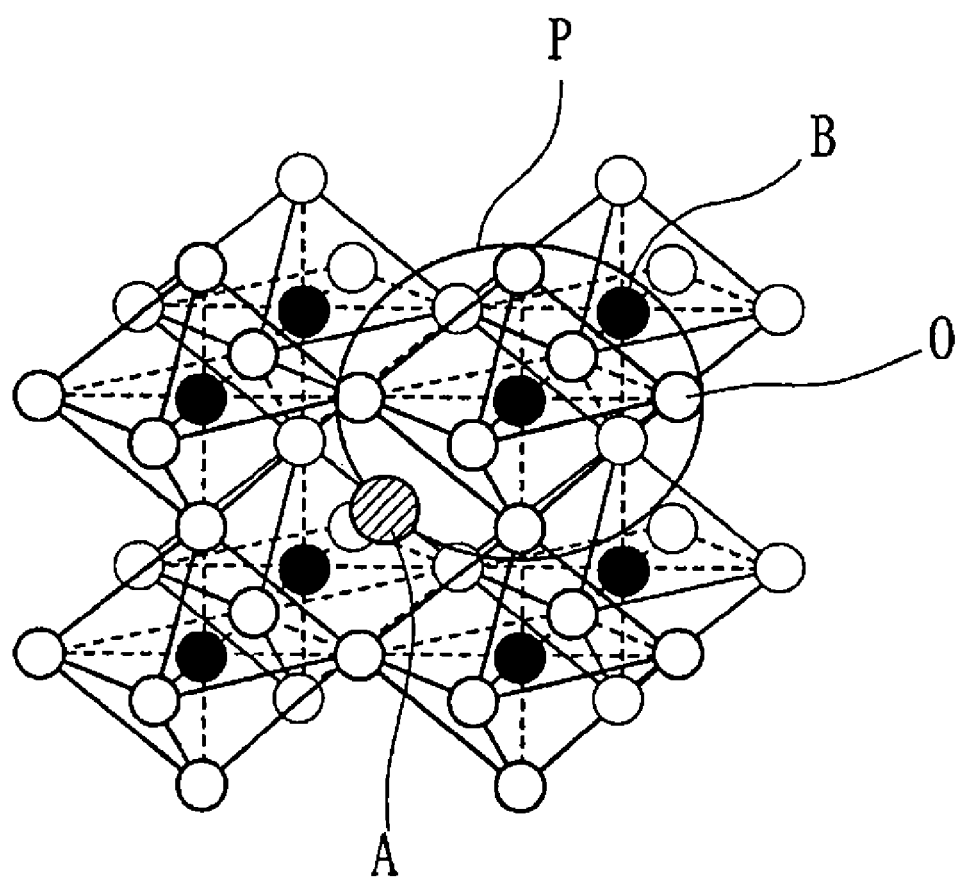
FIG. 1 is a stereographic view schematically showing an oxygen-octahedral perovskite structure.

1 piezoelectric ceramic body
2a, 2b external electrode
3 internal electrode

DETAILED DESCRIPTION OF THE INVENTION

Next, embodiments of the present invention will be described in detail.

A piezoelectric ceramic composition as one embodiment (first embodiment) according to the present invention is represented by the following general formula (A).

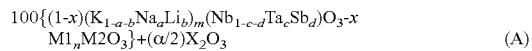

$$100\{(1-x)(K_{1-a-b}Na_aLi_b)_m(Nb_{1-c-d}Ta_cSb_d)O_3\text{-}x M1_nM2O_3\}+(\alpha/2)X_2O_3 \quad (A)$$

In the above formula, M1 represents at least one metal element selected from the group consisting of Ca, Sr, and Ba, M2 represents at least one metal element selected from the group consisting of Ti, Zr, and Sn, and X represents at least one specific element selected from the group consisting of In, Sc, Y, Nd, Sm, Eu, Gd, Tb, Dy, Ho, Er, Yb, and Lu.

In addition, the above α, x, a, b, c, d, m, and n satisfy the following equations (2) to (10).

$$0.1 \leq \alpha \leq 10 \quad (2)$$

$$0.005 \leq x \leq 0.1 \quad (3)$$

$$0 \leq a \leq 0.9 \quad (4)$$

$$0 \leq b \leq 0.3 \quad (5)$$

$$0 \leq a+b \leq 0.9 \quad (6)$$

$$0 \leq c \leq 0.5 \quad (7)$$

$$0 \leq d \leq 0.1 \quad (8)$$

$$0.9 \leq m \leq 1.1 \quad (9)$$

$$0.9 \leq n \leq 1.1 \quad (10)$$

In the piezoelectric ceramic composition, a primary component is formed of $(K_{1-a-b}Na_aLi_b)_m(Nb_{1-c-d}Ta_cSb_d)O_3\text{-}x M1_nM2O_3\}$ having a perovskite structure (general formula $ABO_3$) which is prepared to have a predetermined mixing molar ratio, and 0.1 to 10 moles of a specific element X, such as In or Sc, is contained with respect to 100 moles of the primary component. Hence, as a result, at both a very low and high electric field, the piezoelectric d constant can be improved, and a piezoelectric ceramic composition having desired piezoelectric properties can be obtained.

That is, also as described in the "Background of the Invention" section herein, when a perovskite composite oxide having a specific composition component is solid-solved in $(K,Na,Li)(Nb,Ta)O_3$ as a third component, the piezoelectric d constant can be increased; however, when only a perovskite composite oxide having a specific composition component is simply solid-solved in $(K,Na,Li)(Nb,Ta)O_3$, a sufficiently high piezoelectric d constant (such as 100 pC/N or more) cannot be obtained, and in particular, at a high electric field, the piezoelectric properties are disadvantageously degraded as compared to those of a Pb-based piezoelectric ceramic composition.

In the perovskite structure, as shown in FIG. 1, an oxygen octahedral structure which is primarily composed of B site ions functions as a framework, and A site ions are coordinated in spaces of the framework. In the figure, P indicates the framework of the oxygen octahedral structure, a black ball indicates a B site ion, a hatched ball indicates an A site ion, and a white ball indicates an $O^{2-}$ ion.

Accordingly, for example, in the case of $(K,Na)NbO_3$, in spaces of the framework of an oxygen octahedral structure primarily formed of $Nb^{5+}$, which is a B site ion, $K^+$ and $Na^+$, which are A site ions, are coordinated. In the case of $BaTiO_3$, in spaces of the framework of an oxygen octahedral structure primarily formed of $Ti^{4+}$, which is a B site ion, $Ba^{2+}$, which is an A site ion, is coordinated.

In addition, when perovskite composite oxides having different compositions are homogeneously solid-solved with each other, the different oxygen octahedral structures primarily formed of B site ions must be naturally aligned with each other.

Incidentally, for example, when the valences of B site ions are equal to each other as is the case of $(K,Na)NbO_3$ and $LiSbO_3$, $Nb^{5+}$ and $Sb^{5+}$, which are the B site ions, are relatively freely mixed with each other. Hence, it is believed that even when the above two compounds are solid-solved with each other, a framework of the oxygen octahedral structure is homogeneous as a whole, and that the alignment can be ensured.

However, when perovskite composite oxides having different valences of B site ions are solid-solved with each other, for example, when $(K,Na)NbO_3$ and $BaTiO_3$ are solid-solved, since ions behave so as to maintain a local electric charge balance, only $Nb^{5+}$ is solid-solved around $K^+$, and only $Ti^{4+}$ is solid-solve around $Ba^{2+}$. Hence, it is believed that since $Nb^{5+}$ and $Ti^{4+}$ cannot be freely mixed together, oxygen octahedral structures having different sizes are formed. That is, in the case described above, it is believed that since the alignment between the two oxygen octahedral structures is degraded, it is difficult to obtain a superior piezoelectric ceramic composition, and as a result, the piezoelectric properties are degraded.

Accordingly, in this embodiment, by addition of a predetermined number of moles of a specific element, such as In or Sc, to the primary component, the alignment between oxygen octahedral structures of different perovskite composite oxides is ensured so as to obtain a high piezoelectric d constant at both a very low and a high electric field.

That is, in addition to $(K_{0.5}Na_{0.5})NbO_3$ and $BaTiO_3$, for example, when In in the form of an oxide is added as the specific element, as shown by chemical reaction formula (B), part of In replaces parts of K and Na of $(K_{0.5}Na_{0.5})NbO_3$ and part of Ti of $BaTiO_3$ by solid solution. In works to maintain an entire electric charge balance and is also mixed with parts of Nb and Ti.

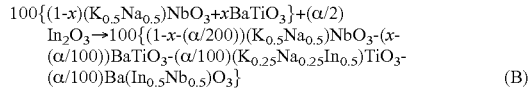
$$100\{(1-x)(K_{0.5}Na_{0.5})NbO_3+xBaTiO_3\}+(\alpha/2)In_2O_3 \rightarrow 100\{(1-x-(\alpha/200))(K_{0.5}Na_{0.5})NbO_3-(x-(\alpha/100))BaTiO_3-(\alpha/100)(K_{0.25}Na_{0.25}In_{0.5})TiO_3-(\alpha/100)Ba(In_{0.5}Nb_{0.5})O_3\} \quad (B)$$

As described above, it is believed that since $In^{3+}$ is mixed with both A site ions and B site ions, a mixed layer reduces misalignment formed between different perovskite composite oxides and generates natural alignment, and hence an alignment layer is formed. It is believed that since an alignment layer such as $\{(\alpha/100)(K_{0.25}Na_{0.25}In_{0.5})TiO_3-(\alpha/100)Ba(In_{0.5}Nb_{0.5})O_3\}$ is present, a sufficiently high piezoelectric d constant can be obtained even at a very low electric field. In addition, since it is believed that this alignment layer forms a domain wall, it is expected that a great number of small domains can be formed as compared to the case in which perovskite composite oxides having the same valence of B site ions are solid-solved with each other. In addition, the above great number of small domains each stretch and contract, and rotate while a high electric field is applied, and hence a large deformation and strain are generated as a whole. As a result, compared to the case in which perovskites having the same valence of B site ions are solid-solved with each other, a significantly high piezoelectric d constant can be obtained under high electric-field drive. Hence it is believed that a piezoelectric ceramic composition having superior piezoelectric properties can be obtained, that is, a high piezoelectric d constant can be obtained not only at a very low electric field but also at a high electric field.

In addition, the above specific element X is limited to at least one selected from the group consisting of In, Sc, Y, Nd, Sm, Eu, Gd, Tb, Dy, Ho, Er, Yb, and Lu. That is, although all the above specific elements X are trivalent metal elements, it does not mean that any trivalent metal elements are not limited. For example, Bi, La, and the like are not appropriate as the addition element, and the specific element X is limited to the aforementioned metal elements.

Next, the reasons $\alpha$, x, a, b, c, d, m, and n are limited to the respective ranges of the above equations (2) to (10) will be described in detail.

(1) a

By addition of the specific element, such as In, as described above, the piezoelectric d constant can be improved at both a very low and a high electric field; however, for this purpose, the molar content $\alpha$ of the specific element X with respect to 100 moles of the primary component must be set to at least 0.1 moles. On the other hand, when the molar content $\alpha$ with respect to 100 moles of the primary component is more than 10 moles, since the content of the specific element X is excessive and is more than the solid solution limit, the specific element X which cannot be solid-solved is precipitated in crystalline grain boundaries to form a conductive layer, and as a result, polarization defects may occur in some cases.

Accordingly, in this embodiment, the molar content $\alpha$ of the specific element X with respect to 100 moles of the primary component is adjusted so as to satisfy $0.1 \leq \alpha \leq 10$.

In addition, when the molar content $\alpha$ is set so as to satisfy $1.5 \leq \alpha \leq 10$, the firing temperature range $\Delta T$ in which a firing treatment can be stably performed can be increased.

That is, according to a conventional piezoelectric ceramic composition, the firing temperature range $\Delta T$ in which a firing treatment can be stably performed is extremely narrow, and when the firing temperature varies during a firing treatment, the defective fraction is increased, and as a result, productivity may be degraded in some cases.

However, according to the experimental results obtained by the inventors of the present invention, it was found that when the molar content $\alpha$ of the specific element X is set so that $1.5 \leq \alpha \leq 10$ holds with respect to 100 moles of the primary component, the firing temperature range $\Delta T$ in which a firing treatment can be stably performed can be increased. Accordingly, since the firing temperature may have a certain level of margin, even when the firing temperature varies to some extent, the sintering properties are not degraded, and hence a piezoelectric ceramic composition having superior piezoelectric properties can be stably obtained with a high efficiency. In particular, the firing temperature range $\Delta T$ can be set to 15° C. or more, and from this point of view, the molar content $\alpha$ of the specific element X is preferably set so that $1.5 \leq \alpha \leq 10$ holds with respect to 100 moles of the primary component.

(2) X x defines the mixing molar ratio of $M1_nM2O_3$ functioning as the third component in the primary component. When x is less than 0.005, the content of $M1_nM2O_3$ is excessively small, the relative dielectric constant $\in r$ and the electromechanical coupling factor kp are both decreased, and as a result, a desired high piezoelectric d constant cannot be obtained thereby. Hence, improvement in piezoelectric properties cannot be achieved. On the other hand, when x is more than 0.1, a Curie point Tc is considerably decreased, and the electromechanical coupling factor kp is rapidly decreased, so that the piezoelectric properties are degraded.

Accordingly, in this embodiment, the composition components are adjusted so as to satisfy $0.005 \leq x \leq 0.1$.

(3) a and b

Whenever necessary, Na and Li are contained in the primary component and are present in a solid-solved state by replacement of part of K. However, when a defining the mixing molar ratio of Na is more than 0.9, a ferroelectric substance cannot be formed, and when b defining the mixing molar ratio of Li is more than 0.3, it exceeds the solid solution limit with K. In both cases described above, piezoelectric properties cannot be obtained. In addition, when the total of a and b is more than 0.9, the relative dielectric constant $\in r$ is considerably decreased, and as a result, a desired high piezoelectric d constant cannot be obtained.

Accordingly, in this embodiment, the composition components are adjusted so that $0 \leq a \leq 0.9$, $0 \leq b \leq 0.3$, and $0 \leq a+b \leq 0.9$ hold.

(4) c

Ta is also contained in the primary component whenever necessary and is present in a solid-solved state by replacement of part of Nb. However, when c defining the mixing molar ratio of Ta is more than 0.5, the electromechanical coupling factor kp is considerably decreased, the piezoelectric d constant is seriously degraded at both a very low and a high electric field, and as a result, desired piezoelectric properties cannot be obtained.

Accordingly, in this embodiment, the composition components are adjusted so that $0 \leq c \leq 0.5$ holds.

(5) d

Sb is also contained in the primary component whenever necessary and is present in a solid-solved state by replacement of part of Nb. However, when d defining the mixing molar ratio of Sb is more than 0.1, the Curie point Tc is considerably decreased, and as a result, piezoelectric properties cannot be obtained.

Accordingly, in this embodiment, the composition components are adjusted so that $0 \leq d \leq 0.1$ holds.

(6) m m defines the mixing molar ratio of the A site to the B site of $(K_{1-a-b}Na_aLi_b)_m(Nb_{1-c-d}Ta_cSb_d)O_3$. When m is less than 0.9, the mixing molar ratio of the A site is excessively small, the electromechanical coupling factor kp is considerably decreased, and at the same time, the piezoelectric d constant is seriously decreased at both a very low and a high electric field, so that desired piezoelectric properties cannot be obtained. On the other hand, when m is more than 1.1, the mixing molar ratio of the A site becomes excessive, resulting in sintering defect.

Accordingly, in this embodiment, the composition components are adjusted so that $0.9 \leq m \leq 1.1$ holds. In addition, in order to obtain a higher piezoelectric d constant, it is preferably set to satisfy $0.9 \leq m \leq 0.99$.

(7) n n defines the mixing molar ratio of the A site to the B site of $M1_nM2O_3$. When n is less than 0.9 or is more than 1.1, in both cases, the electromechanical coupling factor kp is considerably decreased, and the piezoelectric d constant is seriously decreased at both a very low and a high electric field, so that desired piezoelectric properties cannot be obtained. In addition, when n is more than 1.1, the mixing molar ratio of the A site becomes excessive, resulting in sintering defect.

Accordingly, in this embodiment, the composition components are adjusted so that $0.9 \leq n \leq 1.1$ holds.

In this embodiment, since the piezoelectric ceramic composition represented by the general formula (A) is prepared so as to satisfy the equations (2) to (10), a piezoelectric ceramic composition having superior piezoelectric properties can be obtained which exhibits a high piezoelectric d constant at both a very low and a high electric field.

In addition, when the molar content α of the specific element X is adjusted so as to satisfy $1.5 \leq \alpha \leq 10$ with respect to 100 moles of the primary component, the firing temperature range ΔT in which a firing treatment can be stably performed can be increased, and thereby a piezoelectric ceramic composition with superior piezoelectric properties, which has a desired piezoelectric d constant, can be stably obtained with a high efficiency, so that productivity can be improved.

In addition, the present invention is not limited to the piezoelectric ceramic composition of the above embodiment, and whenever necessary, a compound represented by $(M3_{0.5}Bi_{0.5})_pM4O_3$ (where $0.9 \leq p \leq 1.1$ holds, M3 is at least one metal element of K and Na, and M4 is at least one metal element selected from the group consisting of Ti, Zr, and Sn) is also preferably contained in the primary component (second embodiment).

In the case described above, the piezoelectric ceramic composition can be represented by the following general formula (C).

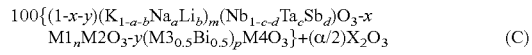

(C)

In the above formula, y satisfies equation (11).

$0 \leq y \leq 0.5$ (11)

Also in the second embodiment, as is the first embodiment, a piezoelectric ceramic composition with superior piezoelectric properties, which has a high piezoelectric $d_{33}$ constant, such as 115 pC/N or more at a very low electric field and 200 pC/N or more at a high electric field, can be stably obtained with a high efficiency.

In addition, also in the second embodiment, when the molar content α of the specific element X is adjusted so that $1.5 \leq \alpha \leq 10$ holds with respect to 100 moles of the primary component, the firing temperature range ΔT in which a firing treatment can be stably performed can be increased, and thereby a piezoelectric ceramic composition with superior piezoelectric properties, which has a desired piezoelectric d constant, can be stably obtained with a high efficiency, so that productivity can be improved.

In addition, the reason the general formula (C) must satisfy the equation (11) is that when y is more than 0.5, it exceeds the solid solution limit, and as a result, piezoelectric properties cannot be obtained.

Hence, when a piezoelectric ceramic composition is formed in accordance with the general formula (C), the equation (11) must be satisfied.

In addition, in the general formulas (A) and (B), 0.1 to 10 moles of at least one selected from the group consisting of Mn, Ni, Fe, Zn, Cu, and Mg is preferably added with respect to 100 moles of the primary component in the form of a solid solution, and thereby the firing temperature range ΔT can be further increased, so that productivity can be further improved (third embodiment).

In the case described above, the piezoelectric ceramic composition can be represented by the following general formula (D) or (E).

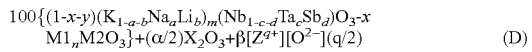

(D)

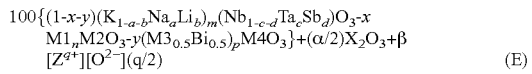

(E)

In the above formulas, Z represents at least one metal element selected from the group consisting of Mn, Ni, Fe, Zn, Cu, and Mg.

The reason the firing temperature range ΔT can be increased when Mn, Ni, Fe, Zn, Cu, and Mg mentioned above are added to the primary component is believed that when these elements are solid-solved in crystal grains, by its contribution to electric charge compensation, an alignment layer can be easily formed, and as a result, the sintering properties are improved.

In addition, the reasons the addition molar amount is set to 0.1 to 10 moles with respect to 100 moles of the primary component are that in order to obtain a further increasing effect of increasing the firing temperature range ΔT, at least 0.1 mole is necessary with respect to 100 moles of the primary component, and that on the other hand, when the addition molar amount is more than 10 moles, sintering defects may occur in some cases.

Accordingly, when Mn, Ni, Fe, Zn, Cu, and Mg are added to the primary component, the content must be set to 0.1 to 10 moles with respect to 100 moles of the primary component.

Next, a piezoelectric electronic component manufactured using the above piezoelectric ceramic composition will be described.

Figure 2:
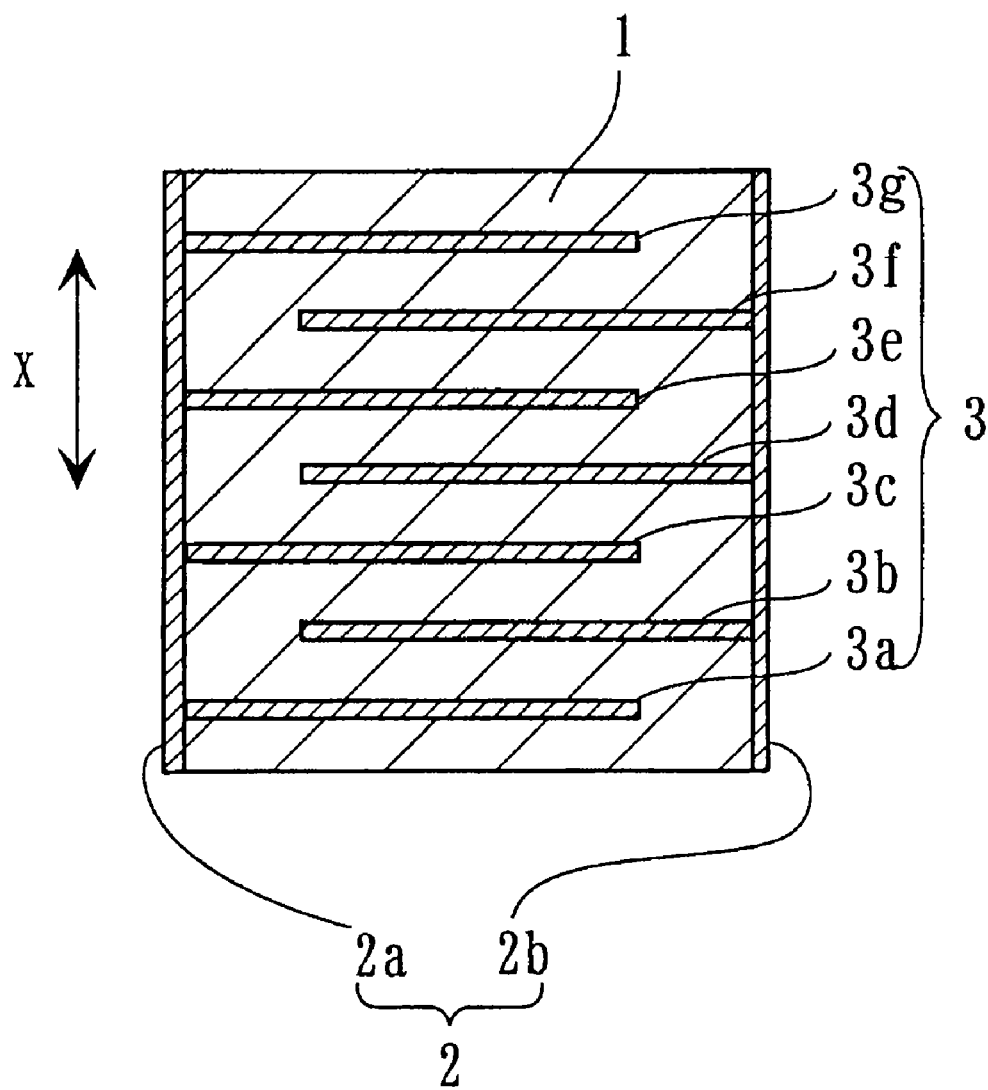
FIG. 2 is a cross-sectional view showing one embodiment of a multilayer piezoelectric actuator as a piezoelectric ceramic electronic component according to the present invention.

FIG. 2 is a cross-sectional view showing one embodiment of a multilayer piezoelectric actuator as a piezoelectric ceramic electronic component according to the present invention. The multilayer piezoelectric actuation is formed of a piezoelectric ceramic body 1, external electrodes 2 (2a and 2b) which are composed of a conductive material such as Ag and which are formed on two end portions of the piezoelectric ceramic body 1, and internal electrodes 3 (3a to 3g) which are composed of a conductive material, such as Ag or Ag—Pd, and which are formed parallel to each other in the piezoelectric ceramic body 1.

In the multilayer piezoelectric actuator, one of the side-ends of the internal electrodes 3a, 3c, 3e, and 3g are electrically connected to one external electrode 2a, and one side-ends of the internal electrodes 3b, 3d, and 3f are electrically connected to the other external electrode 2b. In addition, in the multilayer piezoelectric actuator, when a voltage is applied between the external electrodes 2a and 2b, displacement occurs in the lamination direction shown by an arrow X because of a longitudinal piezoelectric effect.

Next, a method for manufacturing the multilayer piezoelectric actuator will be described in detail.

First, after a predetermined amount of at least one of $CaCO_3$, $SrCO_3$, and $BaCO_3$; a predetermined amount of at least one of $TiO_2$, $ZrO_2$, and $SnO_2$; a predetermined amount of at least one of $In_2O_3$, $Sc_2O_3$, $Y_2O_3$, $Nd_2O_3$, $Sm_2O_3$, $Eu_2O_3$, $Gd_2O_3$, $Tb_4O_7$, $Dy_2O_3$, $Ho_2O_3$, $Er_2O_3$, $Yb_2O_3$, and $Lu_2O_3$; predetermined amounts of $K_2CO_3$ and $Nb_2O_5$; a predetermined amount of at least one of $Na_2CO_3$, $Li_2CO_3$, $Ta_2O_5$, and $Sb_2O_5$ whenever necessary; a predetermined amount of $Bi_2O_3$ whenever necessary; and a predetermined amount of at least one of $MnCO_3$, $NiO$, $Fe_2O_3$, $ZnO$, $CuO$, and $MgCO_3$ are weighed as ceramic starting materials. The starting materials thus weighed are charged in a pulverizer together with an organic solvent and a pulverization medium such as zirconia, and mixing pulverization is sufficiently performed in the organic solvent until an average particle diameter $D_{50}$ of 0.60 μm or less and a specific surface area SSA of 7.0 to 20 $m^2/g$ (preferably 10 to 20 $m^2/g$) are obtained, followed by drying, so that a powdered ceramic raw material is obtained.

By the use of the powdered ceramic raw material having an average particle diameter $D_{50}$ of 0.60 μm or less and a specific surface area SSA of 7.0 to 20 $m^2/g$ (preferably 10 to 20 $m^2/g$), polarization defective fraction of the multilayer piezoelectric actuator can be significantly reduced, and hence the piezoelectric d constant can be further improved.

That is, when the powdered ceramic raw material is formed into fine powder as described above, since the dispersibility of the powdered ceramic raw material is improved, and the sintering temperature of a piezoelectric ceramic composition is decreased, an alkali metal liable to be evaporated during sintering is solid-solved in crystal grains at a temperature lower than the evaporation temperature. Hence, the polarization defective fraction can be significantly reduced, and the piezoelectric d constant can be further improved.

In addition, when the specific surface area SSA is more than 20 $m^2/g$, the degree of pulverization is excessively high, and it becomes difficult to obtain a multilayer piezoelectric actuator by sheet formation. Hence, the specific surface area SSA must be set to 20 $m^2/g$ or less.

In this embodiment, as the pulverizer, as long as a powdered ceramic raw material having the above average particle diameter and specific surface area is obtained, any pulverizer may be used. Although a ball mill may be used, a media stirring mill having a stirring blade is preferably used.

That is, when an alkali niobate-based material as that of this embodiment is used, since an alkali metal is water soluble, a raw material once dissolved in water is not pulverized and is then reprecipitated in the form of a large segregation after drying. Hence, although mixing pulverization is performed in an organic solvent as described above, since pulverization by a ball mill takes a long time, moisture in the air enters the organic solvent during pulverization, and as a result, segregation of an alkali metal may occur in some cases.

On the other hand, since the above media stirring mill having a stirring blade has a strong pulverizing force, a powdered ceramic raw material having an average particle diameter $D_{50}$ of 0.60 μm or less and a specific surface area SSA of 7.0 to 20 $m^2/g$ (preferably 10 to 20 $m^2/g$) can be obtained in a short period of time. Hence entry of moisture contained in the air can be prevented as much as possible.

After the powdered ceramic raw material is formed as described above, it is calcined at a predetermined temperature (such as 600 to 1,000° C.) to form a calcined product, and wet pulverization is then again performed in a pulverizer, so that a powdered raw material before firing is formed.

Next, an organic binder is added to the powdered raw material before firing thus formed, followed by a wet-type mixing treatment, so that a slurry state is formed. Subsequently, by using a doctor blade method or the like, a ceramic green sheet is formed.

Next, by using a conductive paste for internal electrodes containing Ag or Ag—Pd as a primary component, an electrode pattern is formed on the ceramic green sheet by screen printing.

Next, after ceramic green sheets each having the electrode pattern formed by screen printing are laminated to each other and are then sandwiched with ceramic green sheets having no electrode pattern formed by screen printing, press bonding is performed, so that a laminate is formed. Next, this laminate is cut to have a predetermined dimension and is then placed in a sagger made of alumina, followed by a debinder treatment at a predetermined temperature (such as 250 to 500° C.). Subsequently, a firing treatment at a predetermined temperature (such as 1,050 to 1,200° C.) is performed, so that a piezoelectric ceramic body in which internal electrodes are embedded is formed.

Subsequently, after a conductive paste composed of Ag the like for external electrodes is applied on two end portions of the piezoelectric ceramic body, a baking treatment is performed at a predetermined temperature (such as 750 to 850° C.) to form the external electrodes 2a and 2b, and in addition, by performing a predetermined polarization treatment, the multilayer piezoelectric actuator is manufactured. In this embodiment, as long as superior adhesion is obtained, the external electrodes 2a and 2b may be formed, for example, by a thin-film forming method such as a sputtering method or a vacuum evaporation method.

In this embodiment, since the multilayer piezoelectric actuator is manufactured using the piezoelectric ceramic composition according to the present invention, for example, even when a high electric field of 1 kV/mm is applied, a piezoelectric actuator having a high piezoelectric d constant and a large displacement can be obtained.

Incidentally, the present invention is not limited to the above embodiment. Although the multilayer piezoelectric actuator is described as the multilayer ceramic electronic component in the above embodiment, the present invention may also be applied to a single-plate piezoelectric actuator and a bimorph piezoelectric actuator. Of course, the piezoelectric ceramic composition described above may also be further used for various piezoelectric ceramic electronic components such as a piezoelectric oscillator, a piezoelectric buzzer, and a piezoelectric sensor.

Next, examples of the present invention will be concretely described.

EXAMPLE 1

As ceramic starting materials, $K_2CO_3$, $Na_2CO_3$, $Nb_2O_5$, $BaCO_3$, $CaCO_3$, $SrCO_3$, $TiO_2$, $ZrO_2$, $SnO_2$, $In_2O_3$, $Sc_2O_3$, $Yb_2O_3$, $Y_2O_3$, $Nd_2O_3$, $Eu_2O_3$, $Gd_2O_3$, $Dy_2O_3$, $Sm_2O_3$, $Ho_2O_3$, $Er_2O_3$, $Tb_4O_7$, $Lu_2O_3$, $B_2O_3$, and $La_2O_3$ were prepared.

Next, these ceramic starting materials were weighed so as to obtain each composition shown in Table 1 and were then charged in a ball mill, and wet mixing was performed in ethanol for approximately 18 hours. After the mixture thus obtained was dried, calcination was performed at a temperature of 700 to 1,000° C., so that a calcined product was obtained.

Next, after this calcined product was processed by coarse pulverization, an appropriate amount of an organic binder was added thereto, and wet pulverization was then performed in a ball mill for approximately 16 hours, followed by performing particle size control using a 40-mesh sieve.

Next, the powder processed by the particle size control was pressed at a pressure of $9.8 \times 10^7$ to $1.96 \times 10^8$ Pa for a molding treatment to form a disc-shaped molded body having a diameter of 10 mm and a thickness of 1.2 mm, and in addition, this molded body was held at a temperature of 1,050 to 1,200° C. in the air for 2 hours for a firing treatment, so that a ceramic body was obtained.

In this example, after the firing treatment was performed for each sample by changing the firing temperature by 5° C. in a firing temperature range of 1,050 to 1,200° C., and the piezoelectric $d_{33}$ constant at each firing temperature was measured by a $d_{33}$ meter. A firing temperature at which the piezoelectric $d_{33}$ constant becomes maximum was regarded as an optimum firing temperature, and a firing temperature region in which a piezoelectric $d_{33}$ constant corresponding to 80% or more of the maximum piezoelectric $d_{33}$ constant could be obtained was regarded as a firing temperature range $\Delta T$ in which a firing treatment could be stably performed.

Next, by using a vacuum evaporation method, Ag electrodes were formed on two major surfaces of each ceramic body, and a polarization treatment was then performed by applying a direct voltage of 3 kV/mm for 30 minutes in an insulating oil at a bath temperature of 80° C., so that samples having Sample Nos. 1 to 28 were obtained which were represented by the general formula of $$100\{(1-x)(K_{0.5}Na_{0.5})_{0.98}NbO_3\text{-}xM1M2O_3\} + (\alpha/2)X_2O_3.$$

Table 1 shows the composition components of Sample Nos. 1 to 28.

TABLE 1

| Sample NO. | Composition: $100\{(1-x)(K_{0.5}Na_{0.5})_{0.98}NbO_3\text{-}xM1M2O_3\} + (\alpha/2)X_2O_3$ | | | | |
|---|---|---|---|---|---|
| | x | M1 | M2 | X | α |
| 1 | 0.06 | Ba | Ti | In | 2 |
| 2 | 0.06 | Ba | Ti | Sc | 2 |
| 3 | 0.06 | Ba | Ti | Yb | 2 |
| 4 | 0.06 | Ba | Ti | Y | 2 |
| 5 | 0.06 | Ba | Ti | Nd | 2 |
| 6 | 0.06 | Ba | Ti | Eu | 2 |
| 7 | 0.06 | Ba | Ti | Gd | 2 |
| 8 | 0.06 | Ba | Ti | Dy | 2 |
| 9 | 0.06 | Ba | Ti | Sm | 2 |

TABLE 1-continued

| Sample NO. | Composition: $100\{(1-x)(K_{0.5}Na_{0.5})_{0.98}NbO_3\text{-}xM1M2O_3\} + (\alpha/2)X_2O_3$ | | | | |
|---|---|---|---|---|---|
| | x | M1 | M2 | X | α |
| 10 | 0.06 | Ba | Ti | Ho | 2 |
| 11 | 0.06 | Ba | Ti | Er | 2 |
| 12 | 0.06 | Ba | Ti | Tb | 2 |
| 13 | 0.06 | Ba | Ti | Lu | 2 |
| 14 | 0.06 | Ba | Ti | Yb/In | 1/1 |
| 15 | 0.06 | Ba | Ti | Y/In | 1/1 |
| 16* | 0.06 | Ba | Ti | Bi | 2 |
| 17* | 0.06 | Ba | Ti | La | 2 |
| 18* | 0.06 | Ba | Ti | — | — |
| 19 | 0.06 | Ba | Ti | In | 0.1 |
| 20 | 0.06 | Ba | Ti | In | 1 |
| 21 | 0.06 | Ba | Ti | In | 1.5 |
| 22 | 0.06 | Ba | Ti | In | 10 |
| 23* | 0.06 | Ba | Ti | In | 15 |
| 24 | 0.06 | Ca | Ti | In | 2 |
| 25 | 0.06 | Sr | Ti | In | 2 |
| 26 | 0.06 | Ba | Zr | In | 2 |
| 27 | 0.06 | Ba | Sn | In | 2 |
| 28* | 0 | — | — | In | 2 |

*Out of the Range of the Present Invention

Next, the relative dielectric constant ∈r, the electromechanical coupling factor kp, the piezoelectric $d_{33}$ constant at a very low electric field (hereinafter simply referred to as "piezoelectric $d_{33}$ constant"), and piezoelectric $d_{33}$ constant at a high electric field (hereinafter referred to as "high electric-field piezoelectric $d_{33}$ constant"), and the Curie point Tc of Sample Nos. 1 to 28 were measured.

In this example, the relative dielectric constant ∈r was obtained from an electrostatic capacity measured by an impedance analyzer and the sample dimension, and the electromechanical coupling factor kp was obtained by a resonant-antiresonant method using an impedance analyzer.

In addition, the piezoelectric $d_{33}$ constant was obtained using a $d_{33}$ meter from the amount of generated electric charge measured by applying vibration corresponding to that generated when an electric field of approximately 1 V/mm was applied.

In addition, the high electric-field piezoelectric $d_{33}$ constant was obtained through calculation by the steps of measuring the displacement in the thickness direction when an electric field of 1 kV/mm was applied in the thickness direction, dividing this displacement by the thickness to obtain a distortion rate, and dividing the distortion rate by the electric field.

The Curie point Tc was obtained by the steps of measuring temperature properties of the relative dielectric constant ∈r, and calculating the maximum temperature of the relative dielectric constant ∈r.

Table 2 shows the measurement results of Sample Nos. 1 to 28 and the firing temperature ranges $\Delta T$ thereof.

TABLE 2

| Sample NO. | Relative Dielectric Constant ∈r | Electromechanical Coupling Factor kp (%) | Piezoelectric $d_{33}$ Constant (pC/N) | High Electric-Field Piezoelectric $d_{33}$ Constant (pC/N) | Curie Point Tc (° C.) | Firing Temperature Range $\Delta T$ (° C.) |
|---|---|---|---|---|---|---|
| 1 | 1510 | 47.2 | 301 | 594 | 280 | 30 |
| 2 | 1478 | 44.5 | 278 | 542 | 280 | 30 |
| 3 | 1578 | 35.3 | 234 | 438 | 260 | 30 |

TABLE 2-continued

| Sample NO. | Relative Dielectric Constant $\epsilon r$ | Electromechanical Coupling Factor kp (%) | Piezoelectric $d_{33}$ Constant (pC/N) | High Electric-Field Piezoelectric $d_{33}$ Constant (pC/N) | Curie Point Tc (°C.) | Firing Temperature Range $\Delta T$ (°C.) |
|---|---|---|---|---|---|---|
| 4 | 1560 | 30.5 | 202 | 400 | 250 | 30 |
| 5 | 1524 | 26.4 | 167 | 331 | 260 | 20 |
| 6 | 1520 | 28.4 | 180 | 352 | 260 | 20 |
| 7 | 1420 | 28.1 | 176 | 343 | 270 | 20 |
| 8 | 1580 | 30.1 | 202 | 396 | 260 | 30 |
| 9 | 1520 | 33.2 | 210 | 382 | 260 | 30 |
| 10 | 1440 | 31.3 | 208 | 375 | 270 | 30 |
| 11 | 1550 | 32.4 | 215 | 390 | 260 | 30 |
| 12 | 1450 | 26.4 | 162 | 301 | 260 | 30 |
| 13 | 1478 | 43.2 | 268 | 503 | 280 | 30 |
| 14 | 1555 | 46.2 | 297 | 586 | 270 | 35 |
| 15 | 1528 | 45.3 | 295 | 576 | 270 | 35 |
| 16* | 1210 | 13.0 | 75 | 112 | 230 | Low |
| 17* | 1150 | 12.3 | 68 | 100 | 240 | Reproducibility |
| 18* | 1243 | 16.0 | 95 | 135 | 280 | Defective Fraction $\geq 95\%$ |
| 19 | 1170 | 23.2 | 130 | 253 | 280 | 5 |
| 20 | 1198 | 24.3 | 136 | 266 | 280 | 10 |
| 21 | 1507 | 45.6 | 290 | 541 | 280 | 25 |
| 22 | 1486 | 47.3 | 299 | 537 | 280 | 25 |
| 23* | | | No Piezoelectric Properties | | | |
| 24 | 1210 | 40.0 | 227 | 420 | 50 | 35 |
| 25 | 1142 | 39.7 | 221 | 415 | 260 | 35 |
| 26 | 1423 | 39.5 | 247 | 487 | 280 | 30 |
| 27 | 1427 | 39.3 | 245 | 484 | 280 | 30 |
| 28* | 380 | 30.1 | 93 | 124 | 400 | 15 |

*Out of the Range of the Present Invention

Sample Nos. 1 to 17 contained 2 moles in total of at least one trivalent metal element with respect to 100 moles of the primary component represented by the composition formula of $\{0.94(K_{0.5}Na_{0.5})_{0.98}NbO_3\text{-}0.06BaTiO_3\}$.

Since the specific elements (In, Sc, Yb, Y, Nd, Eu, Gd, Dy, Sm, Ho, Er, Tb, and Lu) were added to Sample Nos. 1 to 15 among the above samples, both the relative dielectric constant ∈r and the electromechanical coupling factor kp were high, and as a result, a piezoelectric $d_{33}$ constant of 115 pC/N or more and a high electric-field piezoelectric $d_{33}$ constant of 200 pC/N or more could be achieved, so that superior piezoelectric properties were obtained.

In addition, since the molar content α of each metal element was 2 moles with respect to 100 moles of the primary component, which was in the range of 1.5 to 10 moles, it was found that the firing temperature range $\Delta T$ in which a firing treatment can be stably performed can be increased to 20 to 35° C.

On the other hand, according to Sample Nos. 16 and 17, since Bi and La were contained as a trivalent metal element other than the specific elements, the electromechanical coupling factor kp was extremely decreased, and thereby both the dielectric $d_{33}$ constant and the high electric-field piezoelectric $d_{33}$ constant were low; hence, desired piezoelectric properties could not be obtained. In addition, the firing temperature varied, and firing treatments performed even at the same firing temperature were not likely to be reproduced, so that the defective fraction was 95% or more. The reason for this is believed that since Bi and La cannot be solid-solved in the B site of BaTiO$_3$, an alignment layer between $(K_{0.5}Na_{0.5})NbO_3$ and BaTiO$_3$ cannot be stably formed.

In addition, according to Sample No. 18, any addition element was not contained with respect to the primary component, the firing temperature varied, and firing treatments performed even at the same firing temperature were not likely to be reproduced; hence, the defective fraction was increased to 95% or more.

Accordingly, in order to improve the piezoelectric properties, it was confirmed that it is important to add the specific elements, which are mentioned as elements included in the range of the present invention, to the primary component.

In Sample Nos. 19 to 23, the molar content of In was changed with respect to the primary component represented by the composition formula of

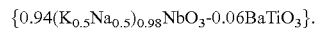
$\{0.94(K_{0.5}Na_{0.5})_{0.98}NbO_3\text{-}0.06BaTiO_3\}$.

According to Sample No. 23, polarization defect occurred, and piezoelectric properties could not be obtained. The reason for this is believed that since the addition molar amount of In is excessive, such as 15 moles, with respect to 100 moles of the primary component, In which cannot be solid-solved in the primary component is precipitated in crystal grain boundaries to form a conductive layer.

On the other hand, according to Sample Nos. 19 to 22, since In in an amount of 0.1 to 10 moles was added with respect to 100 moles of the primary component, a piezoelectric $d_{33}$ constant of 115 pC/N or more and a high electric-field piezoelectric $d_{33}$ constant of 200 pC/N or more were obtained; hence, it was found that superior piezoelectric properties can be obtained.

In addition, according to Sample Nos. 21 and 22, since the molar content α of In with respect to 100 moles of the primary component was 1.5 to 10 moles, it was found that compared to Sample Nos. 19 and 20, the piezoelectric $d_{33}$ constant and the high electric-field piezoelectric $d_{33}$ constant are further improved, and that the firing temperature range $\Delta T$ is also increased. The reason for this is that when the addition amount of In is less than 1.5 moles, since the alignment layer between $(K_{0.5}Na_{0.5})NbO_3$ and $BaTiO_3$ is not sufficiently formed, the piezoelectric properties are slightly decreased, and the firing temperature range $\Delta T$ is decreases to 10° C. or less. However, it is believed that when 1.5 moles or more of In is added, a desired alignment layer is formed, and that as a result, a desired piezoelectric ceramic composition can be obtained.

According to Sample Nos. 24 to 27, individual components of $M1M2O_3$ were changed within the range of the present invention. It was found that superior piezoelectric properties can be obtained so as to have a piezoelectric $d_{33}$ constant of 115 pC/N or more and a high electric-field piezoelectric $d_{33}$ constant of 200 pC/N or more and that the firing temperature range $\Delta T$ can be increased to 30 to 35° C. Hence, it was confirmed that at least one of Ba, Ca, and Sr can be used as M1, and that at least one of Ti, Zr, and Sn can be used as M2.

In addition, according to Sample No. 28, since $M1M2O_3$ was not contained in the composition, the piezoelectric $d_{33}$ constant was less than 100 pC/N, and the high electric-field piezoelectric $d_{33}$ constant was less than 200 pC/N, so that it was confirmed that desired piezoelectric properties cannot be obtained.

EXAMPLE 2

As ceramic starting materials, $K_2CO_3$, $Na_2CO_3$, $LiCO_3$, $Nb_2O_5$, $Ta_2O_5$, $Sb_2O_5$, $BaCO_3$, $TiO_2$, and $In_2O_3$ were prepared, and these ceramic starting materials were weighed so as to obtain each composition shown in Table 3 and were then formed into samples having Sample Nos. 31 to 53 by similar method and procedure to those of [Example 1]. In addition, the firing temperature range $\Delta T$ was also obtained in a manner similar to that of [Example 1].

Next, using the method and procedure of [Example 1], the relative dielectric constant $\epsilon r$, the electromechanical coupling factor kp, the piezoelectric $d_{33}$ constant, the high electric-field piezoelectric $d_{33}$ constant, and the Curie point Tc were measured.

Table 3 shows the component compositions of Sample Nos. 31 to 53, and Table 4 shows the measurement results thereof and the firing temperature ranges $\Delta T$.

TABLE 3

| Sample NO. | Composition: $100\{(1-x)(K_{1-a-b}Na_aLi_b)_m(Nb_{1-c-d}Ta_cSb_d)O_3 - xBa_nTiO_3\} + In_2O_3$ | | | | | | |
|---|---|---|---|---|---|---|---|
| | x | a | b | c | d | m | n |
| 31 | 0.005 | 0.5 | 0 | 0 | 0 | 0.98 | 1 |
| 32 | 0.1 | 0.5 | 0 | 0 | 0 | 0.98 | 1 |
| 33* | 0.15 | 0.5 | 0 | 0 | 0 | 0.98 | 1 |
| 34 | 0.06 | 0 | 0 | 0 | 0 | 0.98 | 1 |
| 35 | 0.06 | 0.9 | 0 | 0 | 0 | 0.98 | 1 |
| 36* | 0.06 | 0.95 | 0 | 0 | 0 | 0.98 | 1 |
| 37 | 0.06 | 0.35 | 0.3 | 0 | 0 | 0.98 | 1 |
| 38* | 0.06 | 0.3 | 0.4 | 0 | 0 | 0.98 | 1 |
| 39 | 0.005 | 0.5 | 0 | 0.5 | 0 | 0.98 | 1 |
| 40* | 0.005 | 0.5 | 0 | 0.6 | 0 | 0.98 | 1 |
| 41 | 0.005 | 0.5 | 0 | 0 | 0.1 | 0.98 | 1 |
| 42* | 0.005 | 0.5 | 0 | 0 | 0.2 | 0.98 | 1 |
| 43* | 0.06 | 0.5 | 0 | 0 | 0 | 0.80 | 1 |
| 44 | 0.06 | 0.5 | 0 | 0 | 0 | 0.90 | 1 |
| 45 | 0.06 | 0.5 | 0 | 0 | 0 | 0.95 | 1 |
| 46 | 0.06 | 0.5 | 0 | 0 | 0 | 0.99 | 1 |
| 47 | 0.06 | 0.5 | 0 | 0 | 0 | 1.00 | 1 |
| 48 | 0.06 | 0.5 | 0 | 0 | 0 | 1.10 | 1 |
| 49* | 0.06 | 0.5 | 0 | 0 | 0 | 1.20 | 1 |
| 50* | 0.005 | 0.5 | 0 | 0 | 0 | 0.98 | 0.8 |
| 51 | 0.005 | 0.5 | 0 | 0 | 0 | 0.98 | 0.9 |
| 52 | 0.005 | 0.5 | 0 | 0 | 0 | 0.98 | 1.1 |
| 53* | 0.005 | 0.5 | 0 | 0 | 0 | 0.98 | 1.2 |

*Out of the Range of the Present Invention

TABLE 4

| Sample No. | Relative Dielectric Constant $\epsilon r$ | Electromechanical Coupling Factor kp (%) | Piezoelectric $d_{33}$ Constant (pC/N) | High Electric-Field Piezoelectric $d_{33}$ Constant (pC/N) | Curie Point Tc (° C.) | Firing Temperature Range $\Delta T$ (° C.) |
|---|---|---|---|---|---|---|
| 31 | 597 | 42.3 | 170 | 320 | 380 | 30 |
| 32 | 1612 | 31.5 | 208 | 402 | 170 | 30 |
| 33* | 2521 | 7.8 | 64 | 87 | 40 | 15 |
| 34 | 1097 | 28.9 | 157 | 304 | 310 | 15 |
| 35 | 1614 | 26.7 | 176 | 340 | 280 | 30 |
| 36* | | | No Piezoelectric Properties | | | |
| 37 | 1523 | 39.8 | 255 | 490 | 280 | 30 |
| 38* | | | No Piezoelectric Properties | | | |
| 39 | 1700 | 32.7 | 221 | 420 | 120 | 30 |
| 40* | 2341 | 5.6 | 44 | 60 | 40 | 30 |
| 41 | 1605 | 37.3 | 245 | 475 | 170 | 30 |
| 42* | | | No Piezoelectric Properties | | | |
| 43* | 1423 | 5.7 | 35 | 40 | 280 | 20 |
| 44 | 1504 | 41.0 | 261 | 506 | 280 | 30 |
| 45 | 1506 | 43.2 | 265 | 516 | 280 | 30 |
| 46 | 1480 | 46.5 | 282 | 532 | 280 | 30 |
| 47 | 1050 | 25.7 | 117 | 224 | 280 | 30 |
| 48 | 970 | 23.4 | 116 | 220 | 280 | 30 |
| 49* | | | — | | | Sintering Defect |
| 50* | 578 | 14.2 | 56 | 68 | 380 | 20 |
| 51 | 692 | 34.8 | 156 | 301 | 380 | 30 |

TABLE 4-continued

| Sample No. | Relative Dielectric Constant εr | Electromechanical Coupling Factor kp (%) | Piezoelectric $d_{33}$ Constant (pC/N) | High Electric-Field Piezoelectric $d_{33}$ Constant (pC/N) | Curie Point Tc (° C.) | Firing Temperature Range ΔT (° C.) |
|---|---|---|---|---|---|---|
| 52 | 611 | 37.3 | 153 | 300 | 380 | 30 |
| 53* | 604 | 10.3 | 42 | 56 | 380 | 30 |

*Out of the Range of the Present Invention

According to Sample No. 33, since x was 0.15 and was more than 0.1, the piezoelectric $d_{33}$ constant was low, such as 64 pC/N, and the high electric-field piezoelectric $d_{33}$ constant was low, such as 87 pC/N; hence, it was found that superior piezoelectric properties cannot be obtained.

On the other hand, according to Samples Nos. 31 and 32, since x was in the range of 0.005 to 0.1, it was confirmed that a piezoelectric ceramic electronic component with superior piezoelectric properties can be obtained which has a piezoelectric $d_{33}$ constant of 115 pC/N or more and a high electric-field piezoelectric $d_{33}$ constant of 200 pC/N or more.

In addition, according to Sample No. 36, since a was 0.95 and was more than 0.9, the mixing molar ratio of Na was excessive to exceed the solid solution limit with K, so that piezoelectric properties were not obtained.

On the other hand, according to Sample Nos. 34 and 35, since a was in the range of 0 to 0.9, it was confirmed that a piezoelectric ceramic electronic component with superior piezoelectric properties can be obtained which has a piezoelectric $d_{33}$ constant of 115 pC/N or more and a high electric-field piezoelectric $d_{33}$ constant of 200 pC/N or more.

In addition, according to Sample No. 38, since b was 0.4 and was more than 0.3, the mixing molar ratio of Li was so excessive that a ferroelectric phase could not be formed, and as a result, piezoelectric properties were not obtained.

On the other hand, according to Sample No. 37, since b was 0.3, it was confirmed that a piezoelectric ceramic electronic component with superior piezoelectric properties can be obtained which has a piezoelectric $d_{33}$ constant of 115 pC/N or more and a high electric-field piezoelectric $d_{33}$ constant of 200 pC/N or more.

In addition, according to Sample No. 40, since c was 0.6 and was more than 0.5, the piezoelectric $d_{33}$ constant and the high electric-field piezoelectric $d_{33}$ constant were low, such as 44 pC/N and 60 pC/N, respectively; hence, it was found that superior piezoelectric properties cannot be obtained.

On the other hand, according to Sample No. 39, since c was 0.5, it was confirmed that a piezoelectric ceramic electronic component with superior piezoelectric properties can be obtained which has a piezoelectric $d_{33}$ constant of 115 pC/N or more and a high electric-field piezoelectric $d_{33}$ constant of 200 pC/N or more.

In addition, according to Sample No. 42, since d was 0.2 and was more than 0.1, Sb was excessive, the Curie point Tc was decreased, and hence piezoelectric properties could not be obtained.

On the other hand, according to Sample No. 41, since d was 0.1, it was confirmed that a piezoelectric ceramic electronic component with superior piezoelectric properties can be obtained which has a piezoelectric $d_{33}$ constant of 115 pC/N or more and a high electric-field piezoelectric $d_{33}$ constant of 200 pC/N or more.

In addition, according to Sample No. 43, since m was 0.8 and was less than 0.9, the piezoelectric $d_{33}$ constant and the high electric-field piezoelectric $d_{33}$ constant were low, such as 35 pC/N and 40 pC/N, respectively; hence, it was found that superior piezoelectric properties cannot be obtained.

In addition, according to Sample No. 49, since m was 1.2 and was more than 1.1, sintering defect occurred.

On the other hand, according to Sample Nos. 44 to 48, since m was in the range of 0.9 to 1.1, a piezoelectric ceramic electronic component with superior piezoelectric properties could be obtained which had a piezoelectric $d_{33}$ constant of 115 pC/N or more and a high electric-field piezoelectric $d_{33}$ constant of 200 pC/N or more.

In particular, when m was set in the range of 0.9 to 0.99 as were the cases of Sample Nos. 44 to 46, the piezoelectric $d_{33}$ constant was 130 pC/N or more, and the high electric-field piezoelectric $d_{33}$ constant was 250 pC/N or more; hence, it was found that the piezoelectric properties can be further improved as compared to those of Sample Nos. 47 and 48.

The reason the piezoelectric properties are slightly degraded when m is more than 0.99 is believed that since the amount of a component, such as K, forming the A site is increased, an element which is not involved in synthetic reaction of a solid solution preferentially reacts with a tetravalent element, such as Ti, forming the B site of the third component, and as a result, a second phase having no piezoelectric properties is partly formed.

According to Sample No. 50, since n was 0.8 and was less than 0.9, the piezoelectric $d_{33}$ constant and the high electric-field piezoelectric $d_{33}$ constant were low, such as 56 pC/N and 68 pC/N, respectively; hence, it was found that superior piezoelectric properties cannot be obtained.

According to Sample No. 53, n was 1.2 and was more than 1.1, the piezoelectric $d_{33}$ constant and the high electric-field piezoelectric $d_{33}$ constant were low, such as 42 pC/N and 56 pC/N, respectively; hence, it was found that superior piezoelectric properties cannot be obtained.

On the other hand, according to Sample Nos. 51 and 52, since n was in the range of 0.9 to 1.1, a piezoelectric ceramic electronic component with superior piezoelectric properties could be obtained which had a piezoelectric $d_{33}$ constant of 115 pC/N or more and a high electric-field piezoelectric $d_{33}$ constant of 200 pC/N or more.

As described above, it was found that when x, a, b, c, d, m, and n are set so that $0.005 \leq x \leq 0.1$, $0 \leq a \leq 0.9$, $0 \leq b \leq 0.3$, $0 \leq a+b \leq 0.9$, $0 \leq c \leq 0.5$, $0 \leq d \leq 0.1$, $0.9 \leq m \leq 1.1$, and $0.9 \leq n \leq 1.1$ hold, a piezoelectric ceramic electronic component with superior piezoelectric properties can be obtained which has a piezoelectric $d_{33}$ constant of 115 pC/N or more and a high electric-field piezoelectric $d_{33}$ constant of 200 pC/N or more.

EXAMPLE 3

As ceramic starting materials, $K_2CO_3$, $Na_2CO_3$, $Nb_2O_5$, $BaCO_3$, $TiO_2$, $Bi_2O_3$, $ZrO_2$, $SnO_2$ and $In_2O_3$ were prepared, and these ceramic starting materials were weighed so as to obtain each composition shown in Table 5 and were then formed into samples having Sample Nos. 61 to 74 by similar method and procedure to those of [Example 1]. In addition, the firing temperature range ΔT was also obtained in a manner similar to that of [Example 1].

Next, using the method and procedure of [Example 1], the relative dielectric constant ∈r, the electromechanical coupling factor kp, the piezoelectric $d_{33}$ constant, the high electric-field piezoelectric $d_{33}$ constant, and the Curie point Tc of Sample Nos. 61 to 74 were measured.

Table 5 shows the component compositions of Sample Nos. 61 to 74, and Table 6 shows the measurement results thereof and the firing temperature ranges ΔT.

TABLE 5

| Sample NO. | Composition: $100\{(1-x-y)(K_{0.5}Na_{0.5})_{0.98}NbO_3 - xM1M2O_3 - y(M3_{0.5}Bi_{0.5})_pM4O_3\} + (\alpha/2)X_2O_3$ | | | | | | | | |
|---|---|---|---|---|---|---|---|---|---|
| | x | y | p | M1 | M2 | M3 | M4 | X | α |
| 61* | 0.03 | 0.05 | 1 | Ba | Ti | Na | Ti | — | — |
| 62 | 0.01 | 0.05 | 1 | Ba | Ti | Na | Ti | In | 2 |
| 63 | 0.01 | 0.05 | 1 | Ba | Ti | Na | Zr | In | 2 |
| 64 | 0.01 | 0.05 | 1 | Ba | Ti | Na | Sn | In | 2 |
| 65 | 0.01 | 0.05 | 1 | Ba | Ti | K | Ti | In | 2 |
| 66 | 0.09 | 0.1 | 1 | Ba | Ti | Na | Ti | In | 2 |
| 67 | 0.005 | 0.005 | 1 | Ba | Ti | Na | Ti | In | 2 |
| 68 | 0.005 | 0.5 | 1 | Ba | Ti | Na | Ti | In | 2 |
| 69* | 0.005 | 0.6 | 1 | Ba | Ti | Na | Ti | In | 2 |
| 70* | 0.06 | 0.005 | 0.8 | Ba | Ti | Na | Ti | In | 2 |
| 71 | 0.06 | 0.005 | 0.9 | Ba | Ti | Na | Ti | In | 2 |
| 72 | 0.06 | 0.005 | 1.1 | Ba | Ti | Na | Ti | In | 2 |
| 73* | 0.06 | 0.005 | 1.2 | Ba | Ti | Na | Ti | In | 2 |
| 74* | 0 | 0 | — | — | — | — | — | In | 2 |

*Out of the Range of the Present Invention

TABLE 6

| Sample NO. | Relative Dielectric Constant ∈r | Electromechanical Coupling Factor kp (%) | Piezoelectric $d_{33}$ Constant (pC/N) | High Electric-Field Piezoelectric $d_{33}$ Constant (pC/N) | Curie Point Tc (° C.) | Firing Temperature Range ΔT (° C.) |
|---|---|---|---|---|---|---|
| 61* | | | — | | | Sintering Defect |
| 62 | 1321 | 47.0 | 281 | 520 | 350 | 35 |
| 63 | 1211 | 43.2 | 246 | 453 | 350 | 35 |
| 64 | 1160 | 40.2 | 223 | 421 | 350 | 35 |
| 65 | 1180 | 40.5 | 230 | 445 | 350 | 30 |
| 66 | 1860 | 46.5 | 323 | 580 | 170 | 30 |
| 67 | 752 | 40.1 | 185 | 350 | 380 | 20 |
| 68 | 1623 | 30.2 | 206 | 400 | 110 | 30 |
| 69* | | | No Piezoelectric Properties | | | |
| 70* | 1480 | 12.0 | 75 | 103 | 260 | 30 |
| 71 | 1475 | 33.2 | 216 | 413 | 260 | 30 |
| 72 | 1485 | 32.4 | 208 | 405 | 260 | 30 |
| 73* | 1480 | 10.6 | 67 | 93 | 260 | 30 |
| 74* | 380 | 30.1 | 93 | 124 | 400 | 15 |

*Out of the Range of the Present Invention

According to Sample No. 61, since no specific element of the present invention was added, sintering defect occurred.

In addition, according to Sample No. 69, since y was 0.6 and was more than 0.5, it exceeded the solid solution limit, and a component, such as Bi, which could not be solid-solved, was precipitated in crystalline grain boundaries, so that piezoelectric properties could not be obtained.

On the other hand, according to Sample Nos. 62 to 68, since x and y were adjusted so as to satisfy $0.005 \leq x \leq 0.1$ and $y \leq 0.5$, respectively, it was found that a piezoelectric ceramic electronic component with superior piezoelectric properties can be obtained which has a piezoelectric $d_{33}$ constant of 115 pC/N or more and a high electric-field piezoelectric $d_{33}$ constant of 200 pC/N or more.

In addition, according to Sample No. 70, since p was 0.8 and was less than 0.9, the piezoelectric $d_{33}$ constant and the high electric-field piezoelectric $d_{33}$ constant were low, such as 75 pC/N and 103 pC/N, respectively; hence it was found that the piezoelectric properties are degraded.

In addition, according to Sample No. 73, since p was 1.2 and was more than 1.1, the piezoelectric $d_{33}$ constant and the high electric-field piezoelectric $d_{33}$ constant were low, such as 67 pC/N and 93 pC/N, respectively; hence it was found that piezoelectric properties are degraded.

Furthermore, according to Sample No. 74, since no M1M2O$_3$ nor (M3$_{0.5}$Bi$_{0.5}$)M4O$_3$ was contained in the primary component, as was the case of Sample No. 28 (Table 2), both the piezoelectric $d_{33}$ constant and the high electric-field piezoelectric $d_{33}$ constant were low, and superior piezoelectric properties could not be obtained.

On the other hand, according to Sample Nos. 71 and 72, since p was 0.9 to 1.1, it was found that a piezoelectric ceramic electronic component with superior piezoelectric properties can be obtained which has a piezoelectric $d_{33}$ constant of 115 pC/N or more and a high electric-field piezoelectric $d_{33}$ constant of 200 pC/N or more.

Even when (M3$_{0.5}$Bi$_{0.5}$)M4O$_3$ was contained in the primary component of the piezoelectric ceramic composition as described above, the piezoelectric properties could be improved. In this case, it was confirmed that y and p must be adjusted so that y is 0.5 or less and $0.9 \leq p \leq 1.1$ holds.

EXAMPLE 4

After predetermined amounts of Mn, Ni, Fe, Zn, Cu, and Mg were added to the composition of Sample No. 1, the piezoelectric properties and the firing temperature ranges ΔT were evaluated.

That is, as ceramic starting materials, K$_2$CO$_3$, Na$_2$CO$_3$, Nb$_2$O$_5$, BaCO$_3$, TiO$_2$, In$_2$O$_3$, MnCO$_3$, NiO, Fe$_2$O$_3$, ZnO, CuO and MgCO$_3$ were prepared, and these ceramic starting materials were weighed so as to obtain each composition shown in Table 7 and were then formed into samples having Sample Nos. 81 to 90 by similar method and procedure to those of [Example 1]. In addition, the firing temperature range ΔT was also obtained in a manner similar to that of [Example 1].

Next, using the method and procedure of [Example 1], the relative dielectric constant ∈r, the electromechanical coupling factor kp, the piezoelectric $d_{33}$ constant, the high electric-field piezoelectric $d_{33}$ constant, and the Curie point Tc of Sample Nos. 81 to 90 were measured.

Table 7 shows the component compositions of Sample Nos. 81 to 90, various measurement results, and the firing temperature ranges ΔT together with the measurement result and the firing temperature range ΔT of Sample No. 1.

represented by the general formula of $[100\{(1-x)(K_{0.5}Na_{0.5})NbO_3\text{-}xBaTiO_3\}+4In_2O_3]$ (x was 0 or 0.06) and were then processed by a mixing pulverization treatment in ethanol using a pulverizer, so that a powdered ceramic raw material was formed.

In particular, for Sample Nos. 101 and 102, a ball mill was used as a pulverizer, PSZ (partially stabilized zirconia) having a diameter of 2 mm was received in the ball mill, and a mixing pulverization treatment was performed in ethanol at a rotation speed of 2.5 $s^{-1}$ (150 rpm) for 960 minutes (16 hours).

In addition, for Sample Nos. 103 to 114, a media stirring mill was used as a pulverizer, PSZ (partially stabilized zirconia) having a diameter of 0.3 mm was received in the media

TABLE 7

Composition:
$100\{0.94(K_{0.48}Na_{0.5})_{0.98}NbO_3\text{—}0.06BaTiO_3\} + In_2O_3 + \beta\,[Z^{q+}][O^{2-}]_{(q/2)}$

| Sample NO. | Z | β (Moles) | Relative Dielectric Constant ∈r | Electromechanical Coupling Factor kp (%) | Piezoelectric $d_{33}$ Constant (pC/N) | High Electric-Field Piezoelectric $d_{33}$ Constant (pC/N) | Curie Point Tc (° C.) | Firing Temperature Range ΔT (° C.) |
|---|---|---|---|---|---|---|---|---|
| 1 | — | 0 | 1510 | 47.2 | 301 | 594 | 280 | 30 |
| 81 | Mn | 1 | 1169 | 36.0 | 206 | 400 | 280 | 50 |
| 82 | Ni | 1 | 1230 | 38.4 | 225 | 432 | 280 | 45 |
| 83 | Fe | 1 | 1682 | 37.3 | 256 | 498 | 280 | 50 |
| 84 | Zn | 1 | 1120 | 33.0 | 200 | 380 | 280 | 55 |
| 85 | Cu | 1 | 1125 | 34.2 | 203 | 375 | 280 | 55 |
| 86 | Mg | 1 | 1625 | 35.3 | 238 | 451 | 280 | 45 |
| 87 | Mn | 0.1 | 1435 | 39.3 | 265 | 510 | 280 | 40 |
| 88 | Mn | 5 | 1154 | 34.5 | 202 | 380 | 280 | 50 |
| 89 | Mn | 10 | 965 | 30.4 | 157 | 287 | 280 | 50 |
| 90* | Mn | 15 | — | — | — | — | — | Sintering Defect |

*Out of the Range of the Present Invention

As apparent from Table 7, according to Sample Nos. 81 to 89, since Mn, Ni, Fe, Zn, Cu, or Mg in an amount of 0.1 to 10 moles was added with respect to 100 moles of the primary component, although the piezoelectric $d_{33}$ constant and the high electric-field piezoelectric $d_{33}$ constant were slightly decreased as compared to those of Sample No. 1, a piezoelectric $d_{33}$ constant of 115 pC/N or more and a high electric-field piezoelectric $d_{33}$ constant of 200 pC/N or more were obtained, and in addition, the firing temperature range ΔT in which sintering was stably performed was increased to 40 to 55° C. That is, compared to Sample No. 1, the firing temperature range ΔT was further increased by approximately 10 to 25° C., and hence it was found that the firing treatment can be performed in a wider temperature range ΔT.

In addition, according to Sample No. 90, the addition molar amount of Mn was large, such as 15 moles, which was more than 10 moles, with respect to 100 moles of the primary component, sintering defect occurred.

Accordingly, it was confirmed that by addition of Mn, Ni, Fe, Zn, Cu, or Mg in an amount of 1 to 10 moles with respect to 100 moles of the primary component, the firing temperature range ΔT can be further increased.

EXAMPLE 5

As ceramic starting materials, $K_2CO_3$, $Na_2CO_3$, $Nb_2O_5$, $BaCO_3$, $TiO_2$, and $In_2O_3$ were prepared, and these ceramic starting materials were weighed so as to obtain a composition stirring mill, the rotation speed at the outermost circumference of a stirring blade was set to 10 m/s, and a mixing pulverization treatment was performed in ethanol for 4 to 30 minutes, so that a powdered ceramic raw material was formed.

Subsequently, by similar method and procedure to those of [Example 1], samples having Sample Nos. 101 to 114 were formed, and the piezoelectric $d_{33}$ constant was measured.

Furthermore, for Sample Nos. 101 to 114, the average particle diameter $D_{50}$ was measured by a laser light scattering particle size analyzer.

In addition, for Sample Nos. 101 to 114, the specific surface area SSA was obtained by a nitrogen gas adsorption method. That is, a $N_2$ gas was adsorbed on the sample surface, the adsorption area was obtained from the adsorbed gas weight and was regarded as a surface area, and the specific surface area SSA was calculated by dividing this surface area by the sample mass.

In addition, by using 30 pieces of each of Sample Nos. 101 to 114, the number of defectives was counted, so that the defective fraction was calculated.

Table 8 shows the compositions, manufacturing conditions, average particle diameter $D_{50}$, specific surface area SSA, polarization defective fraction, and piezoelectric $d_{33}$ constant of Sample Nos. 101 to 114.

TABLE 8

Composition: $100\{(1 - x) (K_{0.5}Na_{0.5})NbO_3 - xBaTiO_3\} + 4In_2O_3$

| | | Manufacturing Conditions | | Powdered Ceramic Raw Material | | Polarization Defective Fraction (—) | Piezoelectric Constant $d_{33}$ (pC/N) |
|---|---|---|---|---|---|---|---|
| Sample NO. | x | Pulverizer | Process Time (min) | Average Particle Diameter $D_{50}$(μm) | Specific Surface Area SSA(m²/g) | | |
| 101* | 0 | Ball Mill | 960 | 0.67 | 3.9 | 3/30 | 110 |
| 102* | 0.06 | Ball Mill | 960 | 0.69 | 3.6 | 28/30 | 240 |
| 103* | 0 | Media Stirring Mill | 4 | 0.63 | 6.1 | 2/30 | 115 |
| 104 | 0 | Media Stirring Mill | 5 | 0.60 | 7.1 | 0/30 | 120 |
| 105 | 0 | Media Stirring Mill | 10 | 0.50 | 10.2 | 0/30 | 170 |
| 106 | 0 | Media Stirring Mill | 15 | 0.49 | 15.7 | 0/30 | 180 |
| 107 | 0 | Media Stirring Mill | 20 | 0.47 | 19.9 | 0/30 | 185 |
| 108* | 0 | Media Stirring Mill | 30 | 0.47 | 29.1 | Molding Defect | |
| 109* | 0.06 | Media Stirring Mill | 4 | 0.65 | 5.8 | 25/30 | 245 |
| 110 | 0.06 | Media Stirring Mill | 5 | 0.60 | 7.1 | 0/30 | 250 |
| 111 | 0.06 | Media Stirring Mill | 10 | 0.49 | 10.0 | 0/30 | 300 |
| 112 | 0.06 | Media Stirring Mill | 15 | 0.48 | 15.5 | 0/30 | 310 |
| 113 | 0.06 | Media Stirring Mill | 20 | 0.47 | 20.0 | 0/30 | 320 |
| 114* | 0.06 | Media Stirring Mill | 30 | 0.47 | 28.0 | Molding Defect | |

*Out of the Range of the Present Invention

When Sample No. 101 is compared with Sample Nos. 104 to 107, in all the samples, x was 0, and piezoelectric ceramic compositions having the same composition were used; however, since mixing pulverization was performed using a ball mill for Sample No. 101, the pulverizing force was weak, and even when a pulverization treatment was performed for a long time, such as 960 minutes, the average particle diameter $D_{50}$ and the specific surface area SSA were 0.67 μm and 3.9 m²/g, respectively, so that a powdered ceramic raw material having a desired particle size could not be obtained. As a result, the polarization defective fraction was 3/30, and there were test pieces having polarization defects.

On the other hand, since mixing pulverization was performed for Sample Nos. 104 to 107 using a media stirring mill having a strong pulverizing force, even when the process time was short, such as 5 to 20 minutes, a ultra fine powder was obtained having an average particle diameter $D_{50}$ of 0.47 to 0.60 μm and a specific surface area SSA of 7.1 to 19.9 m²/g, and there were no test pieces having polarization defects. In addition, when measurement of the piezoelectric constant $d_{33}$ was performed for 27 test pieces of Sample No. 101 which had no polarization defects, the average value was 110 pC/N. On the other hand, the average values of the piezoelectric constant $d_{33}$ of Sample Nos. 104 to 107 were 120 to 185 pC/N, and it was found that the piezoelectric constant $d_{33}$ can also be improved. In particular, as can be seen from Sample Nos. 105 to 107, it was found that when the specific surface area SSA is 10 m²/g or more, the piezoelectric constant $d_{33}$ is significantly improved to 170 pC/N or more.

When Sample Nos. 102 is compared with Sample Nos. 110 to 113, in all the samples, x was 0.06, and piezoelectric ceramic compositions having the same composition were used; however, since mixing pulverization was performed using a ball mill for Sample No. 102, the pulverizing force was weak, and even when a pulverization treatment was performed for a long time, such as 960 minutes, the average particle diameter $D_{50}$ and the specific surface area SSA were 0.69 μm and 3.6 m²/g, respectively, so that a powdered ceramic raw material having a desired particle size could not be obtained. As a result, the polarization defective fraction was 28/30, and most of the test pieces had polarization defects.

On the other hand, since mixing pulverization was performed for Sample Nos. 110 to 113 by a media stirring mill having a strong pulverizing force, even when the process time was short, such as 5 to 20 minutes, a ultra fine powder was obtained having an average particle diameter $D_{50}$ of 0.47 to 0.60 μm and a specific surface area SSA of 7.1 to 20.0 m²/g, and there were no test pieces having polarization defects. In addition, when measurement of the piezoelectric constant $d_{33}$ was performed for 2 test pieces of Sample No. 102 which had no polarization defects, the average value was 240 pC/N. On the other hand, the average values of the piezoelectric constant $d_{33}$ of Sample Nos. 110 to 113 were 250 to 320 pC/N, and it was found that the piezoelectric constant $d_{33}$ can also be improved. In particular, it was found that when the specific surface area SSA is 10 m²/g or more, the piezoelectric constant $d_{33}$ is significantly improved to 300 pC/N or more.

Accordingly, it was confirmed that as a pulverizer, a media stirring mill is advantageously used as compared to a ball mill.

In addition, according to Sample Nos. 103 and 109, although a media stirring mill was used as a pulverizer, since the process time was short, such as 4 minutes, pulverization was not sufficiently performed. Hence, the average particle diameters $D_{50}$ were 0.63 μm and 0.65 μm, respectively, which were more than 0.6 μm, and the specific surface areas SSA were 6.1 m²/g and 5.8 m²/g, respectively, which were less than 7.0 m²/g. Accordingly, the polarization defective fractions were 2/30 and 25/30, respectively, and there were test pieces having polarization defects.

In addition, when measurement of the piezoelectric constant $d_{33}$ was performed for test pieces having no polarization defects, the average values were 115 pC/N and 245 pC/N, respectively, and it was found that the piezoelectric constant $d_{33}$ is lower than that of Sample Nos. 104 to 107 or Sample Nos. 110 to 113.

In addition, according to Sample Nos. 108 and 114, the specific surface areas SSA were 29.1 m²/g and 28.0 m²/g, respectively, which were more than 20 m²/g, and since the degree of pulverization was excessively high, sheet formation could not be performed. Hence, in order not to generate the polarization defective fraction and to obtain a high piezoelectric d constant, it was found that the specific surface area SSA must be set to 20 m²/g or less.

The invention claimed is:

1. A piezoelectric ceramic composition comprising:
   a primary component represented by the formula $(1-x)(K_{1-a-b}Na_aLi_b)_m(Nb_{1-c-d}Ta_cSb_d)O_3$-$xM1_nM2O_3$; and
   0.1 to 10 moles of at least one element selected from the group consisting of In, Sc, Y, Nd, Sm, Eu, Gd, Tb, Dy, Ho, Er, Yb, and Lu with respect to 100 moles of the primary component,
   wherein M1 represents at least one metal element selected from the group consisting of Ca, Sr, and Ba, and
   M2 represents at least one metal element selected from the group consisting of Ti, Zr, and Sn, and
   x, a, b, c, d, m, and n satisfy $0.005 \leq x \leq 0.1$, $0 \leq a \leq 0.9$, $0 \leq b \leq 0.3$, $0 \leq a+b \leq 0.9$, $0 \leq c \leq 0.5$, $0 \leq d \leq 0.1$, $0.9 \leq m \leq 1.1$, and $0.9 \leq n \leq 1.1$, respectively,
   wherein said composition has a piezoelectric $d_{33}$ constant of at least 200 pC/N in a high electric field of 1kV/mm.

2. A piezoelectric ceramic composition comprising:
   a primary component represented by the formula $(1-x)(K_{1-a-b}Na_aLi_b)_m(Nb_{1-c-d}Ta_cSb_d)O_3$-$xM1_nM2O_3$; and
   0.1 to 10 moles of at least one element selected from the group consisting of In, Sc, Y, Nd, Sm, Eu, Gd, Tb, Dy, Ho, Er, Yb, and Lu with respect to 100 moles of the primary component,
   wherein M1 represents at least one metal element selected from the group consisting of Ca, Sr, and Ba, and
   M2 represents at least one metal element selected from the group consisting of Ti, Zr, and Sn, and
   x,a,b,c,d,m, and n satisfy $0.005 \leq x \leq 0.1$, $0 \leq a \leq 0.9$, $0 \leq b \leq 0.3$, $0 \leq a+b \leq 0.9$, $0 \leq c \leq 0.5$, $0 \leq d \leq 0.1$, $0.9 \leq m \leq 1.1$, and $0.9 \leq n \leq 1.1$, respectively, and
   wherein the primary component contains a compound represented by $(M3_{0.5}Bi_{0.5})_pM4O_3$ at a mixing molar ratio of 0.5 or less, wherein $0.9 \leq p \leq 1.1$, M3 is at least one metal element of K and Na, and M4 is at least one metal element selected from the group consisting of Ti, Zr, and Sn.

3. The piezoelectric ceramic composition according to claim 1, wherein the m is in the range $0.9 \leq m \leq 0.99$.

4. The piezoelectric ceramic composition according to claim 1, wherein the ceramic composition contains 1.5 to 10 moles of said at least one element with respect to 100 moles of the primary component.

5. A piezoelectric ceramic composition comprising:
   a primary component represented by the formula $(1-x)(K_{1-a-b}Na_aLib)m(Nb_{1-c-d}Ta_cSb_d)O_3$-$xM1_nM2O_3$; and
   0.1 to 10 moles of at least one element selected from the group consisting of In, Sc, Y, Nd, Sm, Eu, Gd, Th, Dy, Ho, Er, Yb, and Lu with respect to 100 moles of the primary component,
   wherein M1 represents at least one metal element selected from the group consisting of Ca, Sr, and Ba, and
   M2 represents at least one metal element selected from the group consisting of Ti, Zr, and Sn, and
   x,a,b,c,d,m, and n satisfy $0.005 \leq x 0.1$, $0 \leq a \leq 0.9$, $0 \leq b \leq 0.3$, $0 \leq a+b \leq 0.9$, $0 \leq c \leq 0.5$, $0 \leq d \leq 0.1$, $0.9 \leq m \leq 1.1$, and $0.9 \leq n \leq 1.1$, respectively, and
   wherein the ceramic composition contains 0.1 to 10 moles of at least one metal element selected from the group consisting of Mn, Ni, Fe, Zn, Cu, and Mg with respect to 100 moles of the primary component.

6. A method for manufacturing a piezoelectric ceramic composition which comprises a primary component represented by the formula $(1-x)(K_{1-a-b}Na_aLi_b)m(Nb_{1-c-d}Ta_cSb_d)O_3$-$xM1_nM2O_3$ where $0.005 \leq x \leq 0.1$, $0 \leq a \leq 0.9$, $0 \leq b \leq 0.3$, $0 \leq a+b \leq 0.9$, $0 \leq c \leq 0.5$, $0 \leq d \leq 0.1$, $0.9 \leq m \leq 1.1$, and $0.9 \leq n \leq 1.1$, M1 represents at least one metal element selected from the group consisting of Ca, Sr, and Ba, M2 represents at least one metal element selected from the group consisting of Ti, Zr, and Sn; and 0.1 to 10 moles of at least one element selected from the group consisting of In, Sc, Y, Nd, Sm, Eu, Gd, Tb, Dy, Ho, Er, Yb, and Lu with respect to 100 moles of the primary component;
   the method comprising:
   weighing predetermined ceramic starting materials;
   performing a wet mixing pulverization treatment to form a powdered ceramic raw material having an average particle diameter of 0.60 μm or less and a specific surface area in the range of 7.0 to 20.0 m²/g; and
   performing a firing treatment on the powdered ceramic raw material to form the piezoelectric ceramic composition.

7. The method for manufacturing a piezoelectric ceramic composition according to claim 6, wherein the specific surface area is in the range of 10.0 to 20.0 m²/g.

8. The method for manufacturing a piezoelectric ceramic composition according to claim 6,
   wherein the predetermined ceramic starting materials include:
   at least one of $CaCO_3$, $SrCO_3$, and $BaCO_3$;
   at least one of $TiO_2$, $ZrO_2$, and $SnO_2$;
   at least one of $In_2O_3$, $Sc_2O_3$, $Y_2O_3$, $Nd_2O_3$, $Sm_2O_3$, $Eu_2O_3$, $Gd_2O_3$, $Tb_4O_7$ $Dy_2O_3$, $Ho_2O_3$, $Er_2O_3$, $Yb_2O_3$, and $Lu_2O_3$;
   predetermined amounts of $K_2O_3$ and $Nb_2O_5$; and optionally at least one of $MnCO_3$, NiO, $Fe_2O_3$, ZnO, CuO, and $MgCO_3$.

9. The method for manufacturing a piezoelectric ceramic composition according to claim 8, wherein the predetermined ceramic starting materials further include at least one of $Na_2CO_3$, $Li_2CO_3$, $Ta_2O_5$, and $Sb_2O_5$.

10. The method for manufacturing a piezoelectric ceramic composition according to claim 8, wherein the primary component contains a compound represented by $(M3_{0.5}Bi_{0.5})_pM4O_3$ at a mixing molar ratio of 0.5 or less, wherein $0.9 \leq p \leq 1.1$, M3 is at least one metal element of K and Na, and M4 is at least one metal element selected from the group consisting of Ti, Zr, and Sn, and wherein the predetermined ceramic starting materials further include $Bi_2O_3$.

11. A piezoelectric ceramic electronic component comprising:
    a piezoelectric ceramic body comprising the piezoelectric ceramic composition according to claim 1; and
    external electrodes formed on surfaces of the piezoelectric ceramic body.

12. The piezoelectric ceramic electronic component according to claim 11, wherein internal electrodes are embedded in the piezoelectric ceramic body.

13. The piezoelectric ceramic component according to claim 12, wherein the internal electrodes are composed of a conductive material.

14. The piezoelectric ceramic component according to claim 13, wherein the conductive material is selected from the group consisting of Ag and Ag—Pd.

15. The piezoelectric ceramic component according to claim 12, wherein the internal electrodes and the external electrodes are parallel to each other.

16. The piezoelectric ceramic component according to claim 12, wherein one end of a first internal electrode is electrically connected to a corresponding one of the external electrodes, and one end of a second internal electrode is electrically connected to a corresponding second external electrode.

17. The piezoelectric ceramic component according to claim 11, wherein the external electrodes are composed of a conductive material.

18. The piezoelectric ceramic component according to claim 17, wherein the conductive material is Ag.

19. The piezoelectric ceramic component according to claim 11, wherein the external electrodes are formed on two end portions of the piezoelectric ceramic body.

* * * * *